(12) United States Patent
Yanagisawa

(10) Patent No.: US 10,976,339 B2
(45) Date of Patent: Apr. 13, 2021

(54) PHYSICAL QUANTITY SENSOR, INERTIAL MEASUREMENT UNIT, ELECTRONIC APPARATUS, AND VEHICLE

(71) Applicant: Seiko Epson Corporation, Tokyo (JP)

(72) Inventor: Yoshinao Yanagisawa, Minowa (JP)

(73) Assignee: Seiko Epson Corporation

( * ) Notice: Subject to any disclaimer, the term of this patent is extended or adjusted under 35 U.S.C. 154(b) by 187 days.

(21) Appl. No.: 16/059,204

(22) Filed: Aug. 9, 2018

(65) Prior Publication Data

US 2019/0049484 A1   Feb. 14, 2019

(30) Foreign Application Priority Data

Aug. 10, 2017   (JP) .............................. JP2017-155110

(51) Int. Cl.
*G01P 1/02* (2006.01)
*G01P 15/125* (2006.01)
(Continued)

(52) U.S. Cl.
CPC ............ *G01P 15/125* (2013.01); *G01L 1/144* (2013.01); *G01P 1/02* (2013.01); *G01P 1/023* (2013.01); *G01P 15/0802* (2013.01); *G01P 15/18* (2013.01); *B81B 2201/0235* (2013.01); *B81B 2201/0242* (2013.01); *G01C 19/5663* (2013.01); *G01D 5/24* (2013.01)

(58) Field of Classification Search
CPC .......... G01P 15/125; G01P 1/02; G01P 1/023; G01P 15/0802; G01P 15/18; G01L 1/144; G01L 1/142; G01C 19/5663; B81B 2201/0235; B81B 2201/0242; B81B 2201/0228; B81B 2201/025; G01D 5/24

USPC ......... 73/514.16, 335.04, 61.4, 61.42, 61.43, 73/61.61, 861.354–861.357, 304 C, 73/504.02–504.04, 504.12–504.16, 73/514.01, 514.02, 514.18, 514.32, 718, 73/724, 431; 361/280–286; 340/612–614, 618, 626–628; 324/686–689, 750.26, 156

See application file for complete search history.

(56) References Cited

U.S. PATENT DOCUMENTS

| 6,125,696 A * | 10/2000 | Hannan .................. G01F 23/265 324/658 |
| 2014/0312438 A1 | 10/2014 | Takada |
| 2015/0255702 A1 | 9/2015 | Takebayashi et al. |

FOREIGN PATENT DOCUMENTS

| EP | 0 721 108 A2 | 7/1996 |
| EP | 2 365 281 A2 | 9/2011 |

(Continued)

OTHER PUBLICATIONS

Extended European Search Report for Application No. EP 18 18 7960 dated Oct. 12, 2018 (8 pages).

*Primary Examiner* — Robert R Raevis
(74) *Attorney, Agent, or Firm* — Harness, Dickey & Pierce, P.L.C.

(57) ABSTRACT

A physical quantity sensor includes: a container that includes a storage space and a bottom plate that configures an inner bottom surface of the storage space; a sensor element that is attached to the inner bottom surface; a circuit element that is attached to a surface of the sensor element on the opposite side of the inner bottom surface, and is electrically connected with the sensor element; and a ground plane that is provided on the bottom plate. The ground GND plane is provided apart from the inner bottom surface.

16 Claims, 25 Drawing Sheets

(51) Int. Cl.
*G01L 1/14* (2006.01)
*G01P 15/08* (2006.01)
*G01P 15/18* (2013.01)
G01C 19/5663 (2012.01)
G01D 5/24 (2006.01)

(56) References Cited

FOREIGN PATENT DOCUMENTS

| | | | |
|---|---|---|---|
| JP | 2007-139505 A | 6/2007 |
| JP | 2008-288492 A | 11/2008 |
| JP | 2013-063712 A | 4/2013 |

* cited by examiner

PHYSICAL QUANTITY SENSOR, INERTIAL MEASUREMENT UNIT, ELECTRONIC APPARATUS, AND VEHICLE

BACKGROUND

1. Technical Field

The present invention relates to a physical quantity sensor, an inertial measurement unit, an electronic apparatus, and a vehicle.

2. Related Art

In recent years, a physical quantity sensor manufactured using silicon micro electro mechanical system (MEMS) technology was developed as an electronic device. As such a physical quantity sensor, for example, JP-A-2007-139505 discloses an electrostatic capacitance type physical quantity sensor (mechanical quantity sensor) that includes an element having a movable electrode and a fixed electrode disposed so as to face each other in a comb teeth shape and measures a physical quantity based on electrostatic capacitance generated between these two electrodes.

As a method of mounting the sensor in the package, for example, JP-A-2008-288492 discloses a configuration in which a semiconductor chip (microphone chip) is mounted on a bottom surface (inner bottom surface) of a recess of a semiconductor package.

However, in such a configuration, there is a possibility that the characteristics may be deteriorated due to the influence of radiation noise from around the package.

In the electronic device, for example, JP-A-2013-063712 discloses that radiation noise can be shut off by electrically connecting a metallic cover covering an upper surface of a container and a metallic GND (ground) plane disposed on the bottom surface (inner bottom surface) in the container in order to reduce an influence of the radiation noise.

It is clarified by experiments that, in a case where a silicon MEMS type physical quantity sensor element is mounted in the package disclosed in JP-A-2007-139505, JP-A-2008-288492, and JP-A-2013-063712, it is possible to reduce the radiation noise from outside the package. However, that distortion is generated in the physical quantity sensor element, and the temperature characteristic deteriorates by unevenness and distortion on a GND plane surface caused by a residual stress resulting from a difference in a linear expansion coefficient between a bottom plate and a GND plane formed on the inner bottom surface of the package being propagated to the physical quantity sensor element, and thereby a new problem of temperature hysteresis arises.

SUMMARY

An advantage of some aspects of the invention is to solve at least a part of the problems described above, and the invention can be implemented as the following forms or application examples.

APPLICATION EXAMPLE 1

A physical quantity sensor according to this application example includes: a container that includes a storage portion and a bottom plate that configures an inner bottom surface of the storage portion; a sensor element that is attached to the inner bottom surface; a circuit element that is attached to a surface of the sensor element on the opposite side of the inner bottom surface, and is electrically connected with the sensor element; and a GND (ground) plane that is provided on the bottom plate, in which the GND plane is provided apart from the inner bottom surface.

According to the physical quantity sensor of this application example, the GND plane is provided apart from the inner bottom surface and unevenness and distortion of the GND plane surface caused by a residual stress resulting from a difference in a linear expansion coefficient between the GND plane and bottom plate are relaxed by a part of the bottom plate existing between the GND plane and the inner bottom surface and are hardly propagated to the sensor element, and thereby, the temperature hysteresis resulting from the residual stress can be reduced.

APPLICATION EXAMPLE 2

In the physical quantity sensor according to the application example, it is preferable that the GND plane is disposed to overlap with the sensor element in a plan view seen from a direction in which the sensor element and the container overlap with each other.

According to the application example with this configuration, since the GND plane is disposed to overlap with the sensor element in a plan view, the radiation noise from outside the container affecting the sensor element from a side of the bottom plate can be shut off by the GND plane, and thereby the influence of the radiation noise can be reduced.

APPLICATION EXAMPLE 3

In the physical quantity sensor according to the application example, it is preferable that the bottom plate is a multilayered substrate that includes a plurality of stacked substrates (stacked layers).

According to the application example with this configuration, since a plurality of substrates can be provided between the GND plane and the inner bottom surface, the unevenness and the distortion of the GND plane surface caused by the residual stress are further relaxed and harder to propagate to the sensor element, and thereby, the temperature hysteresis can be reduced. Moreover, since it is possible to provide a routing pattern of wiring (metallization) between multiple substrates, it is possible to provide a complicated wiring pattern without increasing a size of the container in the plan view.

APPLICATION EXAMPLE 4

In the physical quantity sensor according to the application example, it is preferable that the number of stacked layers in the multilayered substrate is three.

According to the application example with this configuration, since there interfaces between multiple substrates, it is possible to provide a more complicated wiring pattern.

APPLICATION EXAMPLE 5

In the physical quantity sensor according to the application example, it is preferable that the container includes the bottom plate, an annular substrate stacked on the bottom plate, and a lid with conductivity that seals an opening of a recess such that the recess configured with the bottom plate and the annular substrate is a closed space, and an inner portion of the recess is the storage portion.

According to the application example with this configuration, the sensor element can be shut off from an atmosphere outside the container by storing the sensor element in the enclosed space provided between the flat bottom plate, the annular substrate, and the lid, and a high performance physical quantity sensor can be provided.

APPLICATION EXAMPLE 6

In the physical quantity sensor according to the application example, it is preferable that the lid and the GND plane are electrically connected to each other via a conductive layer formed in a castellation provided on a side surface of the container or a conductor filled in a hole penetrating the annular substrate.

According to the application example with this configuration, since the GND plane and the lid with conductivity are electrically connected by a conductive layer or a conductor, the radiation noise from outside the container affecting the sensor element from the lid side and the bottom plate side of the container can be shut off with the lid and the GND plane, and thereby the influence of the radiation noise can be further reduced.

APPLICATION EXAMPLE 7

In the physical quantity sensor according to the application example, it is preferable that the GND plane is provided between two layers of the multilayered substrate.

According to the application example with this configuration, since the GND plane is provided between any two layers of the multilayered substrate, at least one substrate is interposed between the GND plane and the inner bottom surface, and the unevenness and the distortion of the GND plane surface caused by a residual stress are relaxed and are hardly propagated to the sensor element, and thereby, the temperature hysteresis can be reduced.

APPLICATION EXAMPLE 8

In the physical quantity sensor according to the application example, it is preferable that the GND plane is provided on an outer surface opposite to the inner bottom surface of the bottom plate.

According to the application example with this configuration, since the GND plane is provided on an outer surface opposite to the inner bottom surface of the bottom plate, at least one substrate is interposed between the GND plane and the inner bottom surface, and the unevenness and the distortion of the GND plane surface caused by a residual stress are relaxed and are hardly propagated to the sensor element, and thereby, the temperature hysteresis can be reduced.

APPLICATION EXAMPLE 9

In the physical quantity sensor according to the application example, it is preferable that the container includes a lid that has a recess and the bottom plate seals an opening of the recess such that the recess is a closed space, and an inner portion of the recess is the storage portion.

According to the application example with this configuration, since the container is configured with the lid that has a recess and the bottom plate sealing an opening of the recess, the inside of the recess can be used as a storage portion, and it is possible to store a sensor element.

APPLICATION EXAMPLE 10

In the physical quantity sensor according to the application example, it is preferable that the bottom plate includes a conductor that is filled in a through-hole penetrating the bottom plate at a position overlapping with the GND plane in the plan view, and the lid and the GND plane are electrically connected by the conductor.

According to the application example with this configuration, since the lid and the GND plane are electrically connected by a conductor filled in a through-hole penetrating the bottom plate, the influence of the radiation noise from the lid and the bottom plate can be reduced.

APPLICATION EXAMPLE 11

In the physical quantity sensor according to the application example, it is preferable that the sensor element is adhered to the inner bottom surface by an adhesive, and, in a region overlapping with an adhesion region in which the sensor element adheres to the inner bottom surface by the adhesive in the plan view, the GND plane is provided apart from the inner bottom surface.

According to the application example with this configuration, since the GND plane is provided in the region overlapping with the adhesion region which adheres to the inner bottom surface of the sensor element and is provided apart from the inner bottom surface, the unevenness and the distortion of the GND plane surface caused by a residual stress are relaxed and are hardly propagated to the sensor element, and thereby, the temperature hysteresis can be reduced.

APPLICATION EXAMPLE 12

In the physical quantity sensor according to the application example, it is preferable that, among a plurality of wirings formed in the container, a width of an analog wiring is larger than a width of a signal wiring.

According to the application example with this configuration, by making the width of the analog wiring wider than width of the signal wiring, it is possible to decrease impedance of the analog wiring, and reduce the influence of the radiation noise from outside the container.

APPLICATION EXAMPLE 13

In the physical quantity sensor according to the application example, it is preferable that, when a width of the analog wiring is L1 and a width of the signal wiring is L2, $L1/L2 \geq 2$ is satisfied.

According to the application example with this configuration, by increasing the width of the analog wiring to be twice or more the width of the signal wiring, the influence of the radiation noise from outside the container can be further reduced.

APPLICATION EXAMPLE 14

In the physical quantity sensor according to the application example, it is preferable that the sensor element is an acceleration sensor element.

According to the application example with this configuration, since the temperature hysteresis resulting from the residual stress between the GND plane and bottom plate can be reduced, a highly accurate acceleration signal can be acquired.

APPLICATION EXAMPLE 15

In the physical quantity sensor according to the application example, it is preferable that the physical quantity sensor includes an angular velocity sensor element installed in the container.

According to the application example with this configuration, since a complex sensor can be easily configured, angular velocity data can be acquired in addition to acceleration data.

APPLICATION EXAMPLE 16

An inertial measurement unit according to this application example includes the physical quantity sensor according to any one of application examples; an angular velocity sensor; and a control unit that controls the physical quantity sensor and the angular velocity sensor.

According to this application example, it is possible to provide a more reliable inertial measurement unit with the physical quantity sensor that reduces the temperature hysteresis resulting from the residual stress between the GND plane and bottom plate.

APPLICATION EXAMPLE 17

An electronic apparatus according to this application example includes the physical quantity sensor according to any one of application examples; a control unit that performs control based on a measurement signal output from the physical quantity sensor; and a correction unit that corrects the measurement signal.

According to this application example, it is possible to provide a more reliable electronic apparatus with further improved control reliability with the physical quantity sensor that reduces the temperature hysteresis resulting from the residual stress between the GND plane and bottom plate.

APPLICATION EXAMPLE 18

A vehicle according to this application example includes the physical quantity sensor according to any one of application examples; and an attitude control unit that performs attitude control based on a measurement signal output from the physical quantity sensor.

According to this application example, since the attitude control is performed based on a highly accurate signal output from the physical quantity sensor that reduces the temperature hysteresis resulting from the residual stress between the GND plane and bottom plate, a highly accurate vehicle with attitude control can be provided.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, a physical quantity sensor, an inertial measurement unit, an electronic apparatus, and a vehicle according to the invention will be described in detail based on the embodiments illustrated in attached drawings. The embodiments described below do not unduly limit the contents of the invention described in the appended claims. In addition, all of the configurations described in the present embodiments are not necessarily indispensable constitutional requirements of the invention.

First Embodiment

Figure 1:
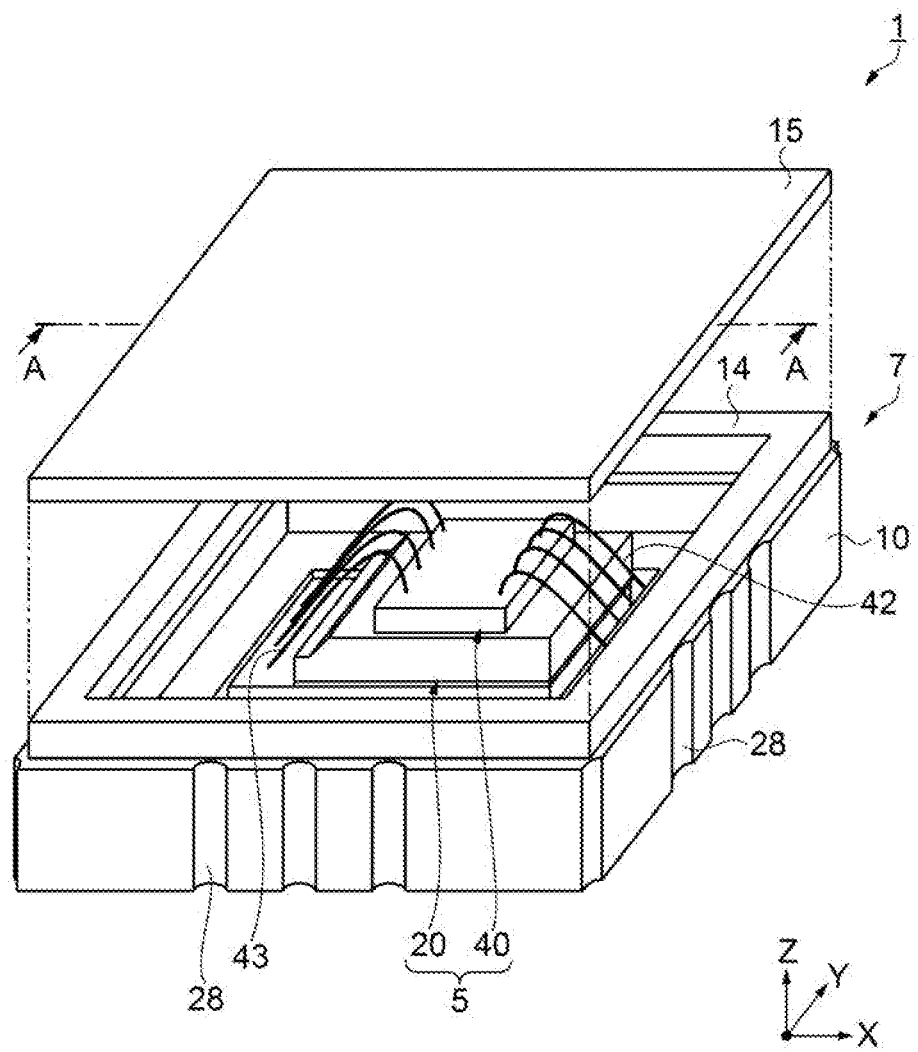
FIG. 1 is a perspective view illustrating a schematic configuration of a physical quantity sensor according to a first embodiment.
Figure 2:
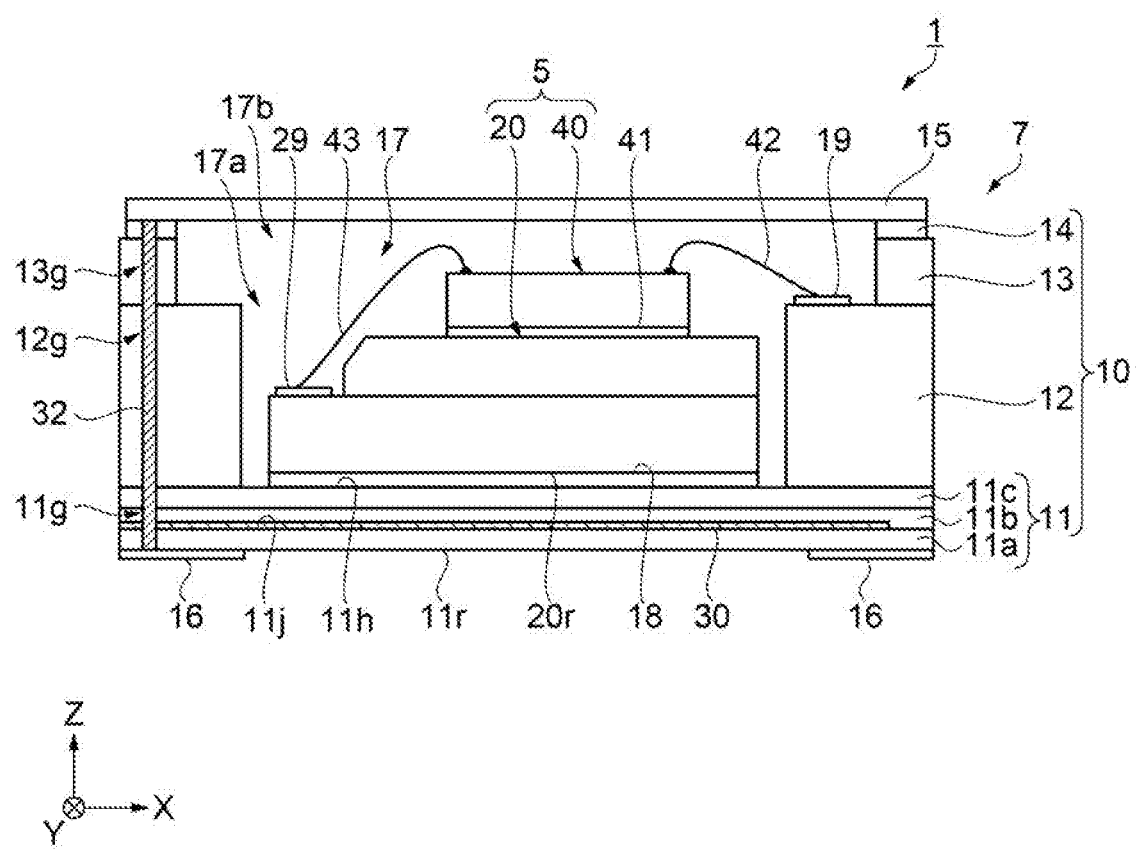
FIG. 2 is a sectional view illustrating a schematic configuration of the physical quantity sensor taken along line A-A in FIG. 1.
Figure 3:
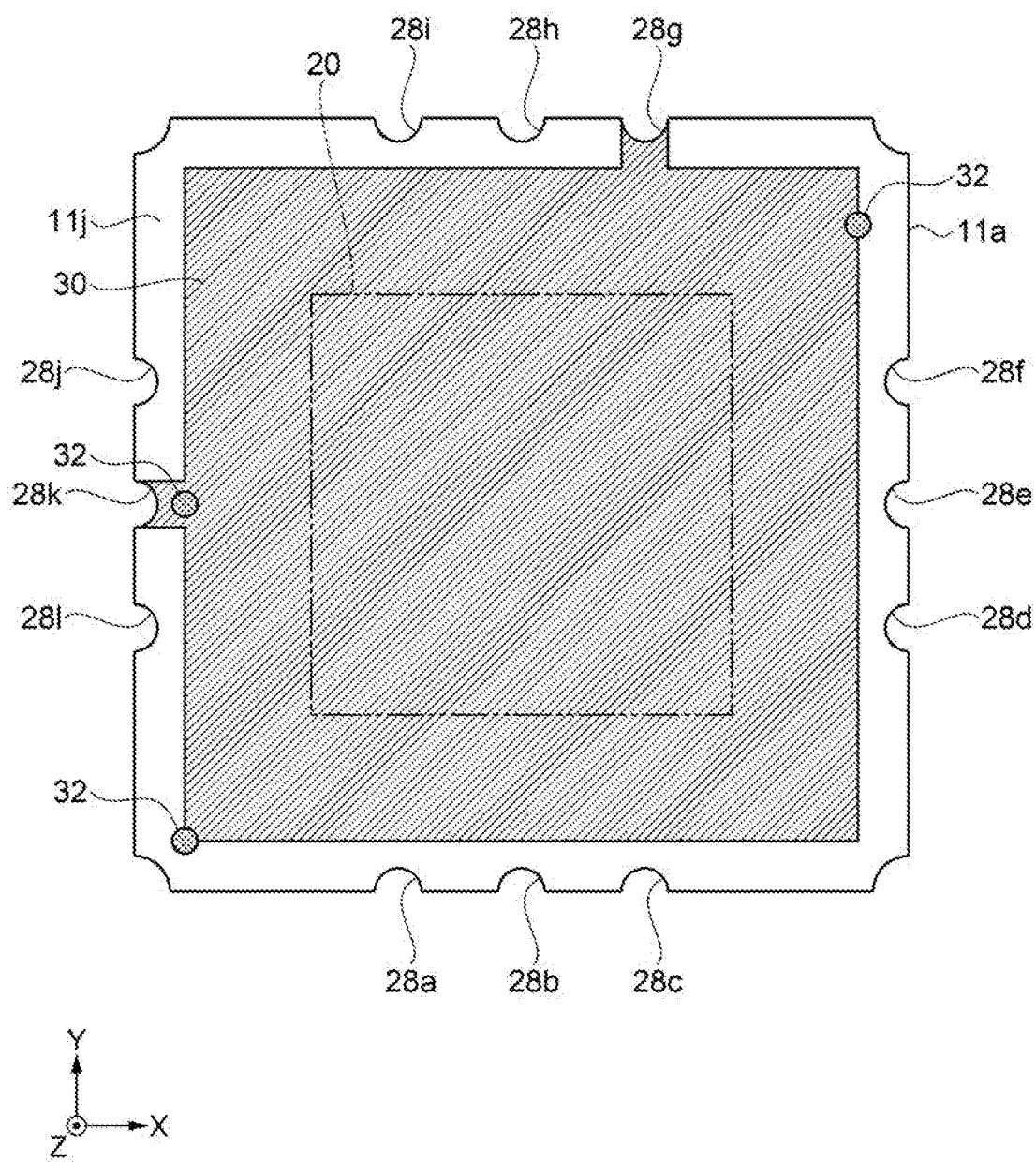
FIG. 3 is a plan view illustrating a schematic configuration of a GND plane provided on a substrate.
Figure 4:
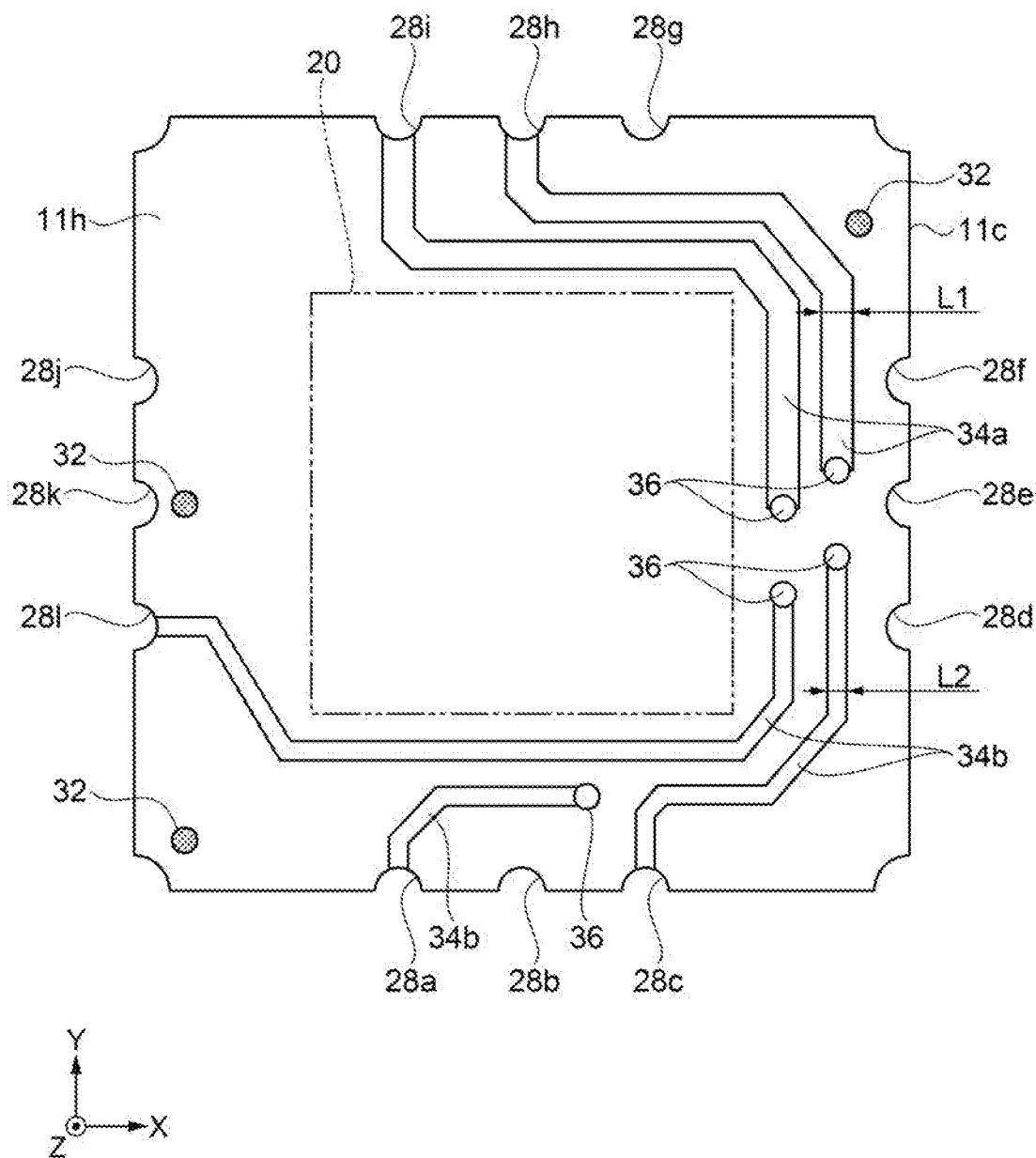
FIG. 4 is a plan view illustrating a schematic configuration of an analog wiring and a signal wiring provided on the substrate.

First, a physical quantity sensor according to a first embodiment will be described with reference to FIGS. 1, 2, 3, and 4. FIG. 1 is a perspective view illustrating a schematic configuration of a physical quantity sensor according to the first embodiment, and FIG. 2 is a sectional view illustrating a schematic configuration of the physical quantity sensor taken along line A-A in FIG. 1. FIG. 3 is a plan view illustrating a schematic configuration of a GND plane provided on a substrate, and FIG. 4 is a plan view illustrating a schematic configuration of an analog wiring and a signal wiring provided on the substrate.

Hereinafter, the three axes orthogonal to each other are described as an X axis, a Y axis, and a Z axis, as described in each drawing including FIGS. 6 to 8C and FIGS. 11 to 20 to be described below. A direction parallel to the X axis is referred to as an "X axis direction", a direction parallel to the Y axis is referred to as a "Y axis direction", and a direction parallel to the Z axis is referred to as a "Z axis direction". A plane including the X axis and the Y axis along a direction in which three sensor units are disposed is referred to as an "XY plane". As the Z axis direction, a direction along a stack (disposal) direction of a base substrate and a lid constituting a package, in other words, a direction along an attachment direction of a sensor element and the base substrate is defined as the Z axis direction. Furthermore, for the sake of convenience of explanation, a surface on a side in a +Z axis direction which is a side of the lid may be referred to as an upper surface, and a surface on a side opposite to a −Z axis direction may be referred to as a lower surface, in a plan view viewed from the Z axis direction.

A physical quantity sensor 1 illustrated in FIGS. 1 and 2 can be used as a 3-axis acceleration sensor that can independently measure acceleration in the X axis direction, the Y axis direction, and the Z axis direction, respectively. Such a physical quantity sensor 1 includes a package 7 and a structure body 5 stored in the package 7. The structure body 5 includes an acceleration sensor element 20 as a sensor element and an integrated circuit (IC) 40 as a circuit element disposed on the acceleration sensor element 20, and a lower surface 20r of the acceleration sensor element 20 is attached and adheres (bonded) to an inner bottom surface 11h of the package 7 by a resin adhesive 18. The IC 40 is attached on the acceleration sensor element 20, in other words, a surface on a side opposite to the inner bottom surface 11h of the acceleration sensor element 20 via an adhesive 41, and is electrically connected to the acceleration sensor element 20 by a bonding wire 43. The IC 40 is also electrically connected to an internal terminal 19 provided inside the package 7 by a bonding wire 42.

Package 7

As illustrated in FIGS. 1 and 2, the package 7 as a container storing the structure body 5 has a rectangular outer edge in a plan view from a direction (+Z axis direction) in which the acceleration sensor element 20 and the package 7 overlap with each other, and includes a base 10 configured with a first base material 11, a second base material 12, and a third base material 13, and a lid 15 as a lid with conductivity connected to the third base material 13 via a sealing member 14. The first base material 11, the second base material 12, and the third base material 13 are stacked in this order to configure the base 10.

The first base material 11 has a flat plate shape, and the second base material 12 and the third base material 13 are annular substrates from which a central portion is removed. The sealing member 14 such as a seal ring or a conductive low melting point glass is formed on a periphery of an upper surface of the third base material 13. The first base material 11 corresponds to a bottom plate.

A plurality of internal terminals 19 are disposed on an upper surface of the second base material 12, and a plurality of external terminals 16 are disposed on an outer bottom surface 11r of the package 7 which is a lower surface of the first base material 11. Each internal terminal 19 is electrically connected to the corresponding external terminal 16 via an internal wiring (not illustrated) and the like formed in the base 10. A plurality of castellations (grooves) 28 are formed on a side surface of the package 7.

As illustrated in FIG. 2, the first base material is a multilayered substrate with a plurality of substrates, three stacked layers in the present embodiment, in which three substrates 11a, 11b, and 11c are stacked. A metallized GND plane 30 (GND plane) is provided (as a sheet or plate) between stacked substrates 11a and 11b on an upper surface 11j of the substrate 11a. In other words, the GND plane 30 is provided in the first base material 11 including the inner bottom surface 11h of the package 7, and is provided apart from (spaced away from) the inner bottom surface 11h. Since the GND plane 30 is provided apart from (separated from) the inner bottom surface 11h and the substrates 11b and 11c are sandwiched therebetween, a surface of the GND plane 30 does not come in contact with the acceleration sensor element 20. For this reason, it is possible to make the unevenness and the distortion on a surface of the GND plane 30 caused by residual stress resulting from a difference in a linear expansion coefficient between the GND plane 30 and the first base material 11 hard to be propagated to the acceleration sensor element 20 disposed on the inner bottom surface 11h.

In the present embodiment, the GND plane 30 is provided between the substrate 11a and the substrate 11b. However, the invention is not limited thereto, and the GND plane 30 may be provided between the substrate 11b and a substrate 11c. That is, by disposing the GND plane 30 between any layers of the multilayered substrate, at least one layer of the substrates 11a, 11b, and 11c is interposed between the GND plane 30 and the inner bottom surface 11h, and thereby, the unevenness and the distortion on a surface of the GND plane 30 caused by residual stress are relaxed, and are hard to be propagated to the acceleration sensor element 20.

Wiring (not illustrated) having a routing pattern is provided between the substrate 11b and a substrate 11c and between the substrate 11c and the second base material 12. It is possible to provide a complicated wiring pattern without increasing the size of the package 7 in the plan view from +Z axis direction by stacking three layers of the substrates 11a, 11b, and 11c and providing the GND plane 30 and a wiring (routing pattern) between each of the substrates 11a, 11b, and 11c. Since there are two interfaces between the substrates by stacking three layers of the substrate 11a, 11b, and 11c, a more complicated wiring pattern can be provided.

As illustrated in FIG. 3, the GND plane 30 provided on the upper surface 11j of the substrate 11a is disposed to overlap with the acceleration sensor element 20 in the plan view from a direction (+Z axis direction) in which the acceleration sensor element 20 and the package 7 overlap with each other. Therefore, it is possible to shut off radiation noise (radiated noise such as electromagnetic waves) from an outside of the package 7 affecting the acceleration sensor element 20 from the first base material 11 side of the package 7, and to reduce the influence of the radiation noise with respect to the acceleration sensor element 20.

The GND plane 30 is electrically connected to a conductor 32 filled in a through-hole provided in the substrate 11a described later, and is electrically connected to an external terminal 16 provided in contact with castellations 28g and 28k on the outer bottom surface 11r of the package 7.

As illustrated in FIG. 4, a plurality of analog wirings 34a and a plurality of signal wirings 34b are provided on an upper surface of the substrate 11c (inner bottom surface 11h). A width L1 of the analog wiring 34a is larger than a width L2 of the signal wiring 34b. By increasing the width L1 of an analog wiring 34a compared to the width L2 of a signal wiring 34b, it is possible to decrease impedance of the analog wiring 34a including a VDD wiring and reduce the influence of the radiation noise from the outside of the package 7. It is also possible to prevent operation noise generated in a digital circuit or the like from affecting an analog circuit through the substrates 11a, 11b, 11c, and the like.

The analog wiring 34a and the signal wiring 34b are electrically connected to a plurality of wirings provided in the plurality of the internal terminals 19 provided on an upper surface of the second base material 12 and the substrate 11b which is a lower surface of the substrate 11c via an electrode layer (not illustrated) formed on inner walls of a plurality of through-holes 36 provided on the substrate 11c. The analog wiring 34a is electrically connected to the external terminal 16 provided in contact with castellations 28h and 28i respectively via an electrode layer (not illustrated) formed on side surfaces of the castellations 28h and 28i. The signal wiring 34b is electrically connected to the external terminal 16 provided in contact with each of castellations 28a, 28c, and 28l via an electrode layer (not illustrated) formed on a side surface of the castellations 28a, 28c, and 28l.

It is more preferable that the width L1 of the analog wiring 34a is L1/L2≥2 with respect to the width L2 of the signal wiring 34b. By making the ratio of the wiring width twice or more, it is possible to further decrease the impedance and to further reduce the influence of the radiation noise from the outside of the package 7.

Back to FIG. 2, the package 7 is provided with a plurality of through-holes 11g that penetrate the first base material 11, through-holes 12g that penetrate the second base material 12 and communicate with the through-hole 11g, and through-holes 13g that penetrate the third base material 13 and communicate with the through-hole 12g in a region where the first base material 11, the second base material 12, and the third base material 13 overlap each other. In the through-hole 11g, the through-hole 12g, and the through-hole 13g, the conductor 32 such as copper or solder is filled, and a through electrode is formed. Therefore, the lid 15 and the GND plane 30 can be electrically connected via conductor 32. Since the radiation noise from the outside of the package 7 affecting the acceleration sensor element 20 can be shut off with the lid 15 and the GND plane 30 from a lid 15 side of the package 7 and the first base material 11 side, the influence of the radiation noise can be further reduced.

A recess 17a as a storage portion (storage space) that stores (houses) the structure body 5 with the annular second base material 12 and third base material 13 from which a central portion is removed is formed in the package 7. The package 7 is provided with a storage space (internal space) 17 that is a closed space (enclosed space) where an opening 17b of the recess 17a is closed, in other words, sealed by the lid 15, and thereby the structure body 5 can be stored in the storage space 17. By storing the structure body 5 configured with the acceleration sensor element 20 and the IC 40 in the storage space 17 provided between the package 7 and the lid 15, the structure body 5 can be shut off from the atmosphere outside the package 7, and achieve the compact physical quantity sensor 1 with high performance. A part of an electrode pad (terminal electrode) and a wiring pattern formed in the base 10 including the first base material 11 and the second base material 12 are not illustrated.

Ceramics or the like is suitably used for the constituent materials of the first base material 11, the second base material 12, and the third base material 13. Glass, resin, metal, and the like can be used for the constituent materials of the first base material 11, the second base material 12, and the third base material 13 in addition to ceramics. The constituent material of the lid 15 may be any material having conductivity, and for example, a metallic material such as Kovar, or materials such as a glass material, a silicon material, and a ceramic material metallized with metal can be used.

The GND plane 30, the analog wiring 34a, the signal wiring 34b, the internal terminal 19, and the external terminal 16 may be formed by a method in which a metal wiring material such as tungsten (W) and molybdenum (Mo) is screen-printed at a predetermined position and baked, and plating nickel (Ni), gold (Au) or the like is applied thereon.

Structure Body 5

The structure body 5 includes the acceleration sensor element 20 and the IC 40 as a circuit element which is electrically connected to the acceleration sensor element 20, and adheres to the acceleration sensor element 20 by the adhesive 41. In other words, the IC 40 is attached on a surface of the acceleration sensor element 20 on the side opposite to the lower surface 20r which is the surface of the package 7 on the side of the first base material 11. It is possible to increase the disposal efficiency in the plane direction and to reduce the area of the physical quantity sensor 1 in the plan view, by stacking the package 7, the acceleration sensor element 20, and the IC 40.

As illustrated in FIG. 2, the lower surface 20r of the acceleration sensor element 20 is bonded with the inner bottom surface 11h which is an upper surface the first base material 11 constituting the base 10 as a bottom plate by the resin adhesive 18 in the structure body 5, and the structure body 5 is stored in the storage space 17 of the package 7. The storage space 17 of the package 7 is airtightly sealed in a reduced pressure atmosphere lower than atmospheric pressure or in an inert gas atmosphere such as nitrogen, argon, and helium.

Figure 5:
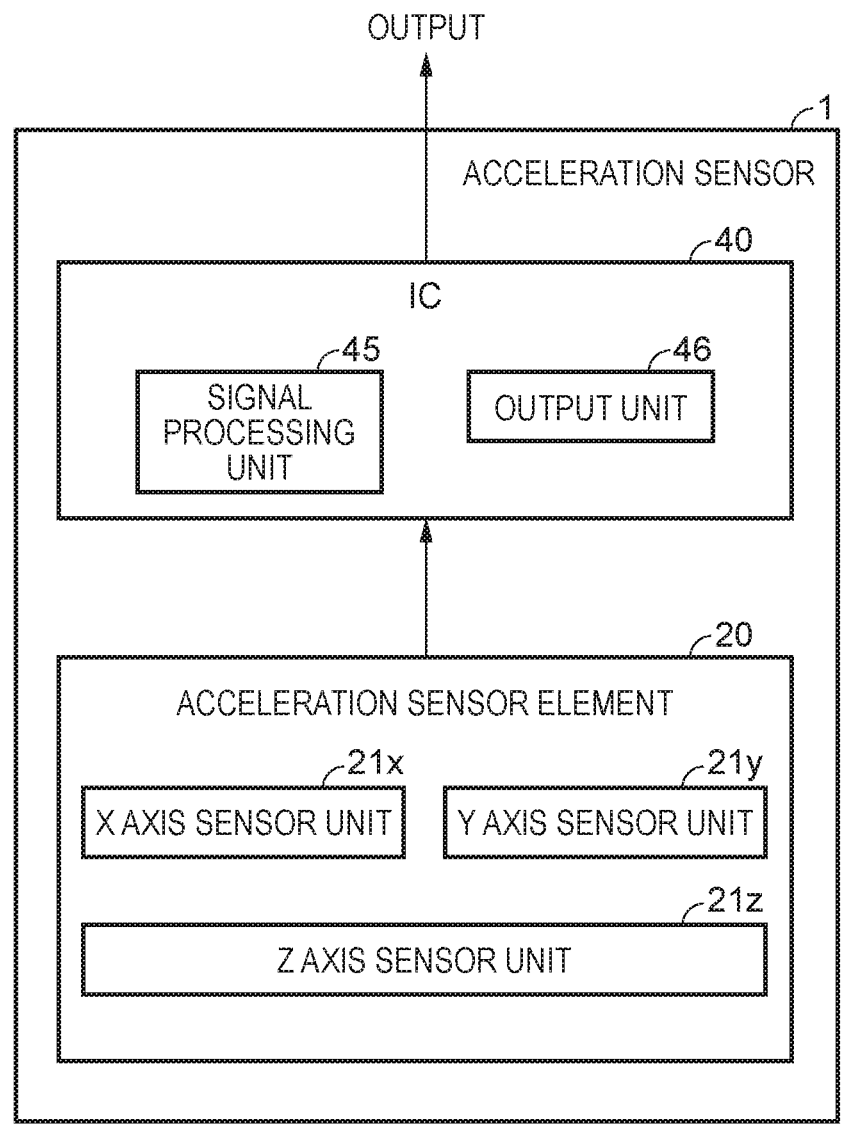
FIG. 5 is a functional block diagram of the physical quantity sensor.

Next, a functional configuration of the physical quantity sensor will be described with reference to FIG. 5. FIG. 5 is a functional block diagram of the physical quantity sensor.

As illustrated in FIG. 5, the acceleration sensor element 20 includes an X axis sensor unit 21x, a Y axis sensor unit 21y, and a Z axis sensor unit 21z each of which can measure acceleration in the X axis direction, the Y axis direction, and the Z axis direction independently as a functional configuration of the physical quantity sensor 1. The X axis sensor unit 21x and the Y axis sensor unit 21y measure an acceleration of two axes in an XY plane direction (X axis direction and Y axis direction), the Z axis sensor unit 21z measures an acceleration in the Z axis direction orthogonal to the XY plane direction, and the measured data is transmitted to the IC 40 as a signal indicating data of change in electrostatic capacitance. The IC 40 includes a signal processing unit 45 and an output unit 46. The IC 40 converts the signal indicating change in the electrostatic capacitance sent from the acceleration sensor element 20 to a user friendly format, for example, a bias method by the signal processing unit 45, and outputs the signal from the output unit 46 as acceleration data.

The acceleration sensor element 20 and the IC 40 constituting the structure body 5 are electrically connected by the bonding wire 43. The IC 40 is electrically connected to the internal terminal 19 provided in the package 7 (upper surface of second base material 12) by the bonding wire 42.

Acceleration Sensor Element 20

Figure 6:
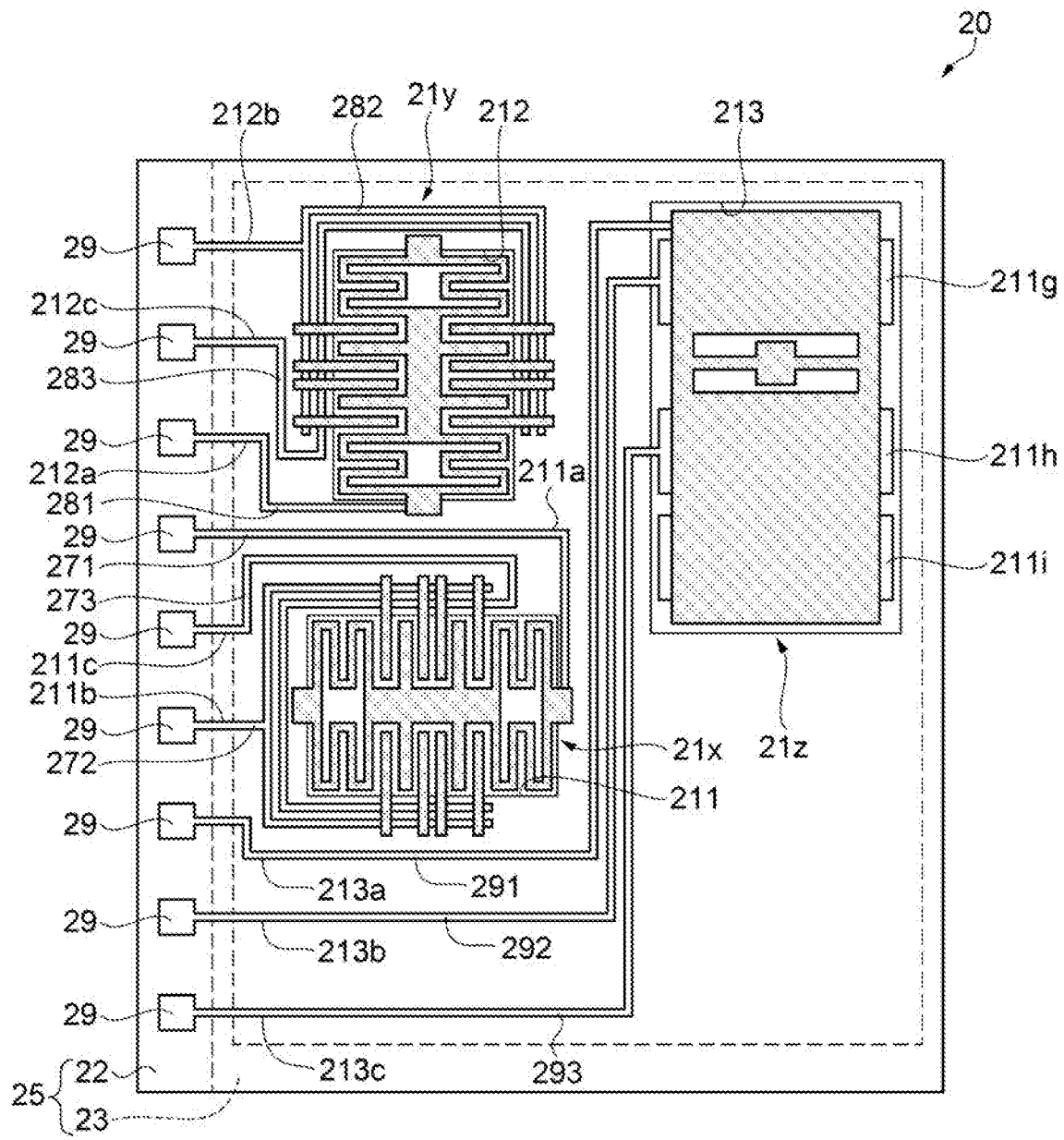
FIG. 6 is a plan view illustrating a disposal example of sensor elements used for the physical quantity sensor.

Next, the sensor element used in the physical quantity sensor will be described with reference to FIGS. 6 and 7. FIG. 6 is a plan view illustrating a disposal example of sensor elements used for the physical quantity sensor, and FIG. 7 is a cross-sectional view illustrating a schematic configuration of the sensor element.

Figure 7:
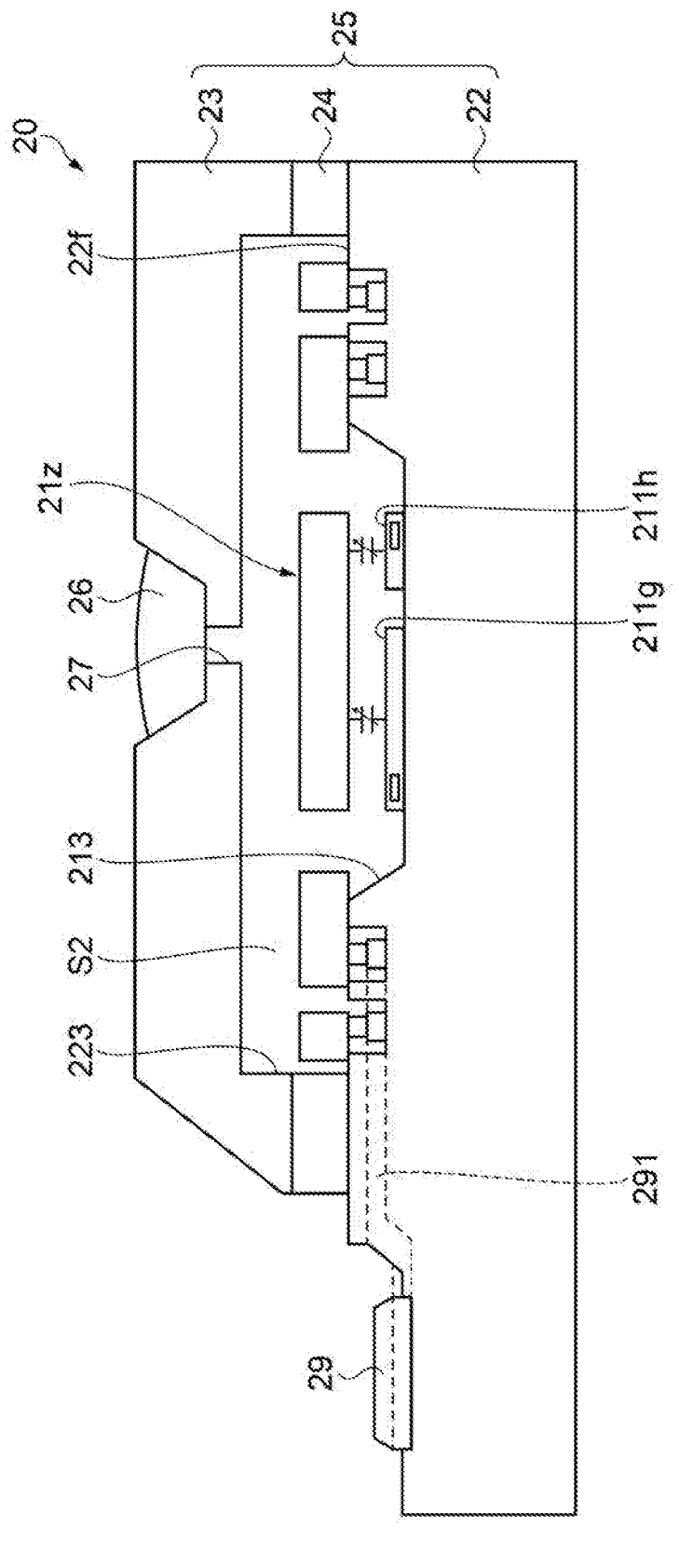
FIG. 7 is a sectional view illustrating a schematic configuration of the sensor element.

As illustrated in FIGS. 6 and 7, the acceleration sensor element 20 as a sensor element includes a container 25 including a base substrate 22 and a cap portion 23 and three sensor units, the X axis sensor unit 21x, the Y axis sensor unit 21y, and the Z axis sensor unit 21z stored in the container 25. For the sake of convenience of explanation, only the Z axis sensor unit 21z is illustrated in FIG. 7.

The recess portions 211, 212, and 213 are formed on an upper side of the base substrate 22. Among these, the recess portion 211 functions as a relief portion for preventing contact between the X axis sensor unit 21x disposed thereabove and the base substrate 22. Similarly, the recess portion 212 functions as a relief portion for preventing contact between the Y axis sensor unit 21y disposed thereabove and the base substrate 22. The recess portion 213 functions as a relief portion for preventing contact between the Z axis sensor unit 21z disposed thereabove and the base substrate 22.

In addition, recess portions 211a, 211b, and 211c, recess portions 212a, 212b, and 212c, and recess portions 213a, 213b, and 213c opening to an upper surface are formed on the base substrate 22. Among these, the recess portions 211a, 211b, and 211c are disposed around the recess portion 211, and wirings 271, 272, and 273 for the X axis sensor unit 21x are disposed in these recess portions 211a, 211b, and 211c. The recess portions 212a, 212b, and 212c are disposed around the recess portion 212 and wirings 281, 282, and 283 for the Y axis sensor unit 21y are disposed in the recess portions 212a, 212b, and 212c. The recess portions 213a, 213b, and 213c are disposed around the recess portion 213 and wirings 291, 292, and 293 for the Z axis sensor unit 21z are disposed in the recess portions 213a, 213b, and 213c. Each end of these wirings 271, 272, 273, 281, 282, 283, 291, 292, and 293 is exposed to the outside of, the container 25, and the exposed part thereof is a connection terminal 29. Each connection terminal 29 is electrically connected to an electrode pad (not illustrated) of the IC 40 via the bonding wire 43.

Such a base substrate 22 is formed of, for example, a glass material (borosilicate glass such as Pyrex (registered trademark) glass, for example) including an alkali metal ion (mobile ion). Accordingly, the X axis sensor unit 21x, the Y axis sensor unit 21y, and the Z axis sensor unit 21z formed of a silicon substrate can be firmly bonded to the base substrate 22 by anodic bonding. Since light transmittance can be imparted to the base substrate 22, the internal portion of the container 25 can be observed through the base substrate 22. However, a constituent material of the base substrate 22 is not limited to a glass material, and a silicon material with high resistance can be used, for example. In this case, the bonding of the X axis sensor unit 21x, the Y axis sensor unit 21y, and the Z axis sensor unit 21z can be performed via a resin type adhesive, glass paste, a metal layer or the like, for example.

Figure 8A:
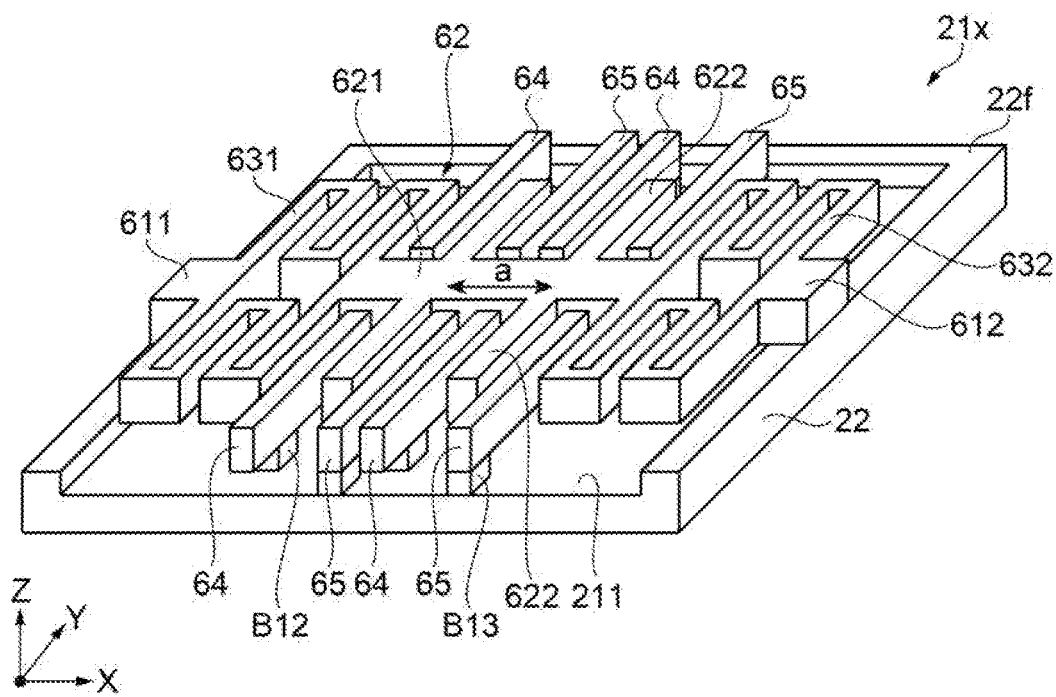
FIG. 8A is a perspective view illustrating a schematic configuration of a sensor unit (X axis direction measurement) of the sensor element.
Figure 8B:
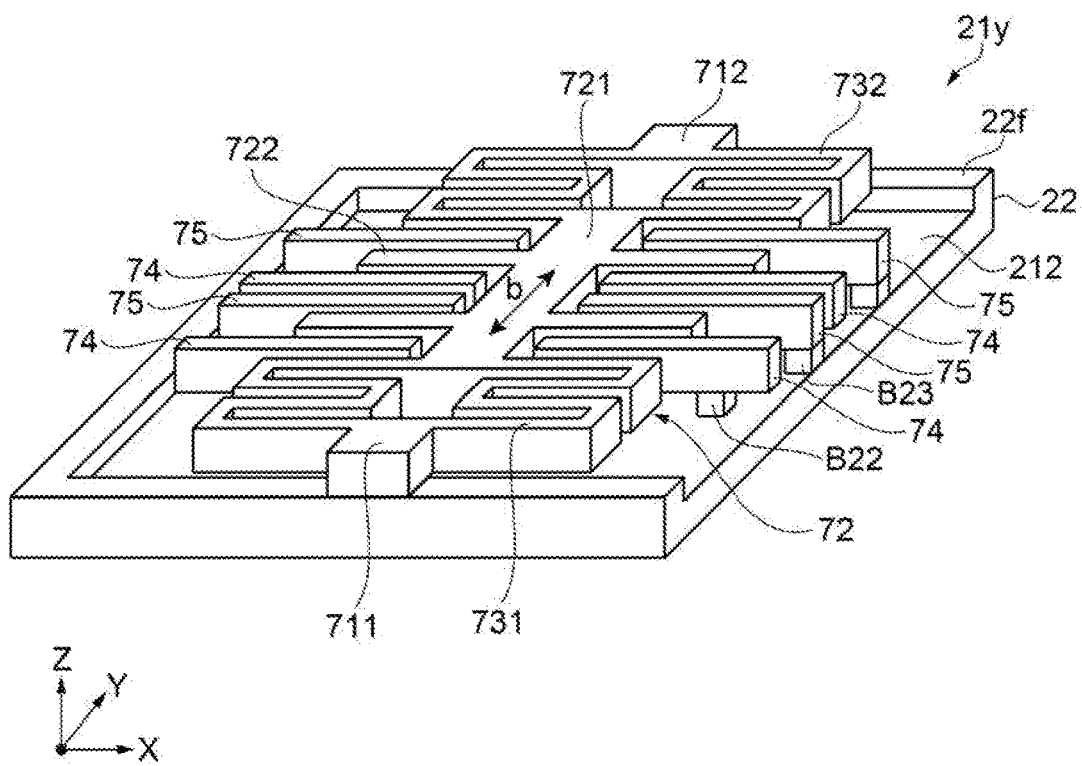
FIG. 8B is a perspective view illustrating a schematic configuration of a sensor unit (Y axis direction measurement) of the sensor element.
Figure 8C:
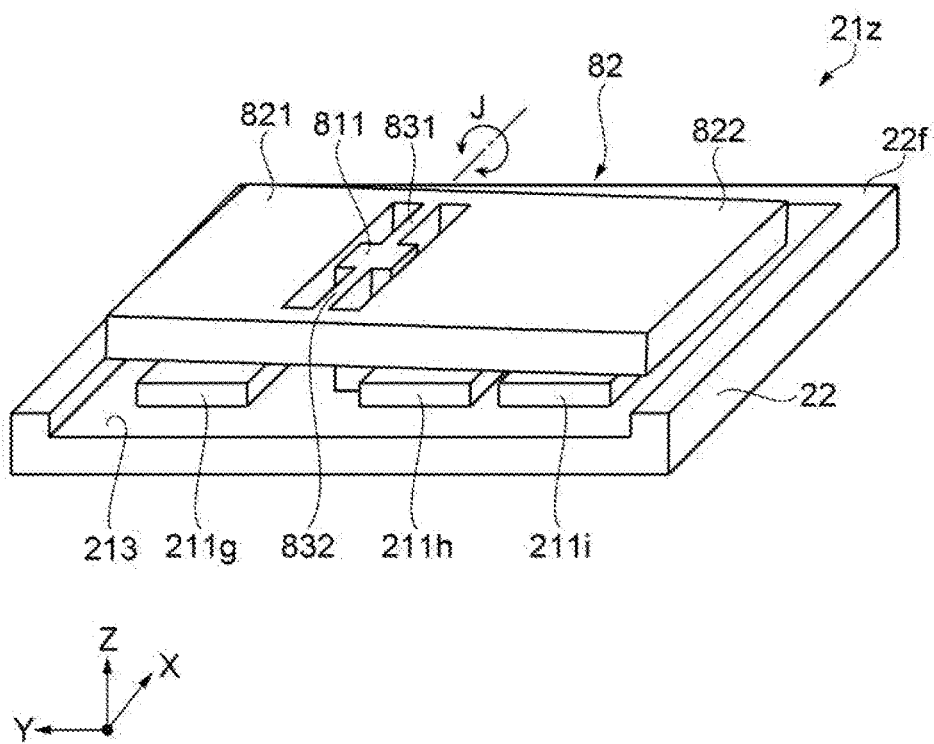
FIG. 8C is a perspective view illustrating a schematic configuration of a sensor unit (Z axis direction measurement) of the sensor element.

Next, the sensor unit of the sensor element will be described with reference to FIGS. 8A, 8B, and 8C. FIG. 8A is a perspective view illustrating a schematic configuration of a sensor unit (X axis direction measurement) of the sensor element, FIG. 8B is a perspective view illustrating a schematic configuration of a sensor unit (Y axis direction measurement) of the sensor element, and FIG. 8C is a perspective view illustrating a schematic configuration of a sensor unit (Z axis direction measurement) of the sensor element.

The X axis sensor unit 21x which is one of the sensor units is a portion that measures the acceleration in the X axis direction. As illustrated in FIG. 8A, such an X axis sensor unit 21x includes support portions 611 and 612, a movable portion 62, coupling portions 631 and 632, a plurality of first fixed electrode fingers 64, and a plurality of second fixed electrode fingers 65. The movable portion 62 includes a base 621 and a plurality of movable electrode fingers 622 projecting from both sides in the Y axis direction from the base 621. Such an X axis sensor unit 21x is formed of a silicon substrate doped with impurities such as phosphorus and boron, for example, and the silicon substrate has conductivity.

The support portions 611 and 612 are anodically bonded to an upper surface 22f of the base substrate 22, and the support portion 611 is electrically connected to a wiring 271 via a conductive bump (not illustrated). The movable portion 62 is provided between these support portions 611 and 612. The movable portion 62 is coupled with the support portions 611 and 612 via coupling portions 631 and 632. Since the coupling portions 631 and 632 are elastically deformable like a spring in the X axis direction, the movable portion 62 can be displaced in the X axis direction as indicated by an arrow a with respect to the support portions 611 and 612.

The plurality of first fixed electrode fingers 64 are disposed on one side of the movable electrode fingers 622 in the X axis direction, and are lined up in a comb teeth shape meshing with the corresponding movable electrode fingers 622 with an interval therebetween. The plurality of first fixed electrode fingers 64 are anodically bonded to an upper surface of the recess portion 211 of the base substrate 22 at a base end portion thereof, and are electrically connected to the wiring 272 via a conductive bump B12.

The plurality of second fixed electrode fingers 65 are disposed on the other side of the movable electrode fingers 622 in the X axis direction, and are lined up in a comb teeth shape meshing with the corresponding movable electrode fingers 622 with an interval therebetween. The plurality of second fixed electrode fingers 65 are anodically bonded to the upper surface 22f of the base substrate 22 at a base end portion thereof, and are electrically connected to the wiring 273 via a conductive bump B13.

The acceleration in the X axis direction is measured as follows using such an X axis sensor unit 21*x*. That is, when acceleration is applied in the X axis direction, the movable portion 62 is displaced in the X axis direction while elastically deforming the coupling portions 631 and 632 based on the magnitude of the acceleration. With this displacement, each magnitude of electrostatic capacitance between the movable electrode finger 622 and the first fixed electrode finger 64 and electrostatic capacitance between the movable electrode fingers 622 and the second fixed electrode finger 65 changes. The acceleration is obtained by the IC 40 based on the change in the corresponding electrostatic capacitance.

The Y axis sensor unit 21*y* which is one of the sensor units is a portion that measures the acceleration in the Y axis direction. The Y axis sensor unit 21*y* has the same configuration with the X axis sensor unit 21*x* except that it is disposed in a state rotated 90° in the plan view. As illustrated in FIG. 8B, the Y axis sensor unit 21*y* includes support portions 711 and 712, a movable portion 72, coupling portions 731 and 732, a plurality of first fixed electrode fingers 74, and a plurality of second fixed electrode fingers 75. The movable portion 72 includes a base 721, and a plurality of movable electrode fingers 722 projecting from both sides in the X axis direction from the base 721.

The support portions 711 and 712 are anodically bonded to the upper surface 22*f* of the base substrate 22, and the support portion 711 is electrically connected to a wiring 281 via a conductive bump (not illustrated). The movable portion 72 is provided between these support portions 711 and 712. The movable portion 72 is coupled with the support portions 711 and 712 via coupling portions 731 and 732. Since the coupling portions 731 and 732 are elastically deformable like a spring in the Y axis direction, the movable portion 72 can be displaced in the Y axis direction as indicated by an arrow b with respect to the support portions 711 and 712.

The plurality of first fixed electrode fingers 74 are disposed in one side of the movable electrode fingers 722 in the Y axis direction, and are lined up in a comb teeth shape meshing with the corresponding movable electrode fingers 722 with an interval therebetween. The plurality of first fixed electrode fingers 74 are anodically bonded to an upper surface of the recess portion 212 of the base substrate 22 at a base end portion thereof, and are electrically connected to wirings 282 via a conductive bump B22.

On the other hand, the plurality of second fixed electrode fingers 75 are disposed on the other side of the movable electrode fingers 722 in the Y axis direction, and are lined up in a comb teeth shape meshing with the corresponding movable electrode fingers 722 with an interval therebetween. The plurality of second fixed electrode fingers 75 are anodically bonded to the upper surface 22*f* of the base substrate 22 at a base end portion thereof, and are electrically connected to wirings 283 via a conductive bump B23.

The acceleration in the Y axis direction is measured as follows using such a Y axis sensor unit 21*y*. That is, when acceleration is applied in the Y axis direction, the movable portion 72 is displaced in the Y axis direction while elastically deforming the coupling portions 731 and 732 based on the magnitude of the acceleration. With this displacement, each magnitude of electrostatic capacitance between the movable electrode finger 722 and the first fixed electrode finger 74 and electrostatic capacitance between the movable electrode finger 722 and the second fixed electrode finger 75 changes. The acceleration is obtained by the IC 40 based on the change in the corresponding electrostatic capacitance.

The Z axis sensor unit 21*z* which is one of the sensor units is a portion that measures the acceleration in the Z axis direction (vertical direction). As illustrated in FIG. 8C, such a Z axis sensor unit 21*z* includes a support portion 811, a movable portion 82, and a pair of coupling portions 831 and 832 that couples the movable portion 82 with the support portion 811 to be rocked, and the movable portion 82 rocks in a seesaw manner with respect to the support portion 811 with the coupling portions 831 and 832 as an axis J. Such a Z axis sensor unit 21*z* is formed of a silicon substrate doped with impurities such as phosphorus and boron, for example, and the silicon substrate has conductivity.

The support portion 811 is anodically bonded to the upper surface 22*f* of the base substrate 22, and the support portion 811 is electrically connected to a wiring 291 via a conductive bump (not illustrated). The movable portion 82 is provided on both sides of the support portion 811 in the Y axis direction. The movable portion 82 includes a first movable portion 821 that is positioned on a side in a +Y direction from the axis J and a second movable portion 822 that is positioned on a side in a −Y direction from the axis J and is larger than the first movable portion 821. The first movable portion 821 and the second movable portion 822 have different rotational moments when acceleration is applied in the vertical direction (Z axis direction), and are designed so that a predetermined inclination is generated in the movable portion 82 according to the acceleration. When acceleration occurs in the Z axis direction, the movable portion 82 rocks in a seesaw manner around the axis J.

A first measurement electrode 211*g* electrically connected to a wiring 292 is disposed at a position facing the first movable portion 821 of a bottom surface of a recess portion 213, and a second measurement electrode 211*h* electrically connected to a wiring 293 is disposed at position facing the second movable portion 822. Therefore, electrostatic capacitance is formed between the first movable portion 821 and the first measurement electrode 211*g* and between the second movable portion 822 and the second measurement electrode 211*h*. A dummy electrode 211*i* may be provided at a position facing the second movable portion 822, and on the −Y axis side from the second measurement electrode 211*h*. It is preferable that the first measurement electrode 211*g*, the second measurement electrode 211*h*, and the dummy electrode 211*i* are composed of a transparent conductive material such as ITO, for example.

The acceleration in the Z axis direction is measured as follows using such a Z axis sensor unit 21*z*. That is, when acceleration is applied in the Z axis direction, the movable portion 82 rocks in a seesaw manner around the axis J. A separation distance between the first movable portion 821 and the first measurement electrode 211*g* and a separation distance between the second movable portion 822 and the second measurement electrode 221*h* change by rocking of the movable portion 82 in a seesaw manner, and thereby, the electrostatic capacitance therebetween changes. The acceleration is obtained by the IC 40 based on the change in the corresponding electrostatic capacitance.

As illustrated in FIG. 7, the cap portion 23 has a recess portion 223 opening to a lower surface, and the recess portion 223 is bonded to the base substrate 22 such that the recess portion 223 forms an internal space with recess portions 211, 212, and 213. Such a cap portion 23 is formed with a silicon substrate in the present embodiment. The cap portion 23 and the base substrate 22 are airtightly bonded using a glass frit 24. In the cap portion 23, a stepped sealing hole 27 that penetrates from the recess portion 223 to outside is provided. The sealing hole 27 is sealed with a molten metal 26, for example, a melted gold-germanium alloy (AuGe) in a state where an internal space S2 is set to a nitrogen (N$_2$) atmosphere.

IC 40

As illustrated in FIG. 2, the IC 40 is disposed on an upper surface of the acceleration sensor element 20 via adhesive 41. The adhesive 41 is not particularly limited as long as the IC 40 can be fixed on the acceleration sensor element 20, and for example, solder, silver paste, a resin adhesive (die attach material), or the like can be used.

The IC 40 includes, for example, a drive circuit that drives the acceleration sensor element 20, a measurement circuit (signal processing unit 45) that measures acceleration in each axis direction of the X axis, the Y axis and the Z axis based on the signal from the acceleration sensor element 20, and an output circuit (output unit 46) that converts a signal from the measurement circuit into a predetermined signal and outputs the signal. The IC 40 also includes a plurality of electrode pads (not illustrated) on an upper surface. Each electrode pad is electrically connected to the internal terminal 19 of the second base material 12 via the bonding wire 42 and each electrode pad is electrically connected to the connection terminal 29 of the acceleration sensor element 20 via the bonding wire 43. Accordingly, it is possible to control the acceleration sensor element 20.

Figure 9A:
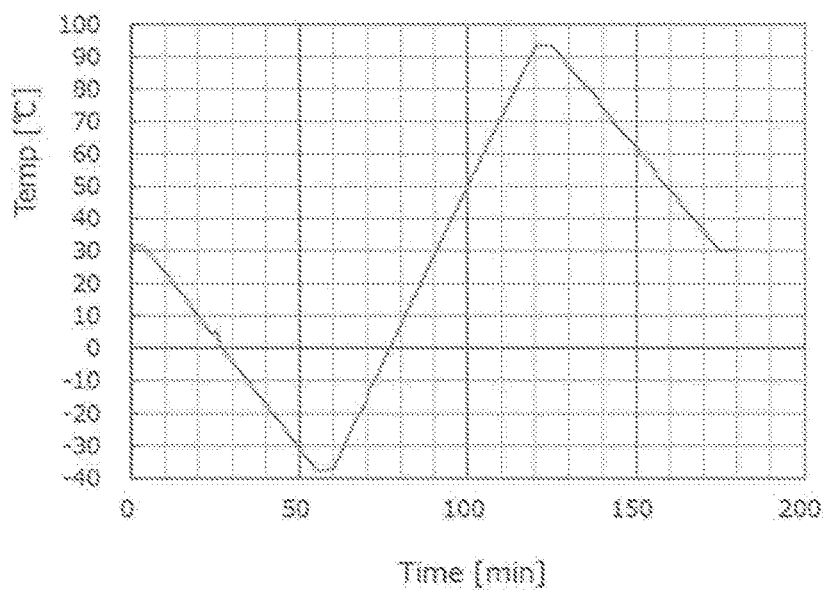
FIG. 9A is a graph illustrating a temperature profile for measuring a temperature hysteresis of the physical quantity sensor.
Figure 9B:
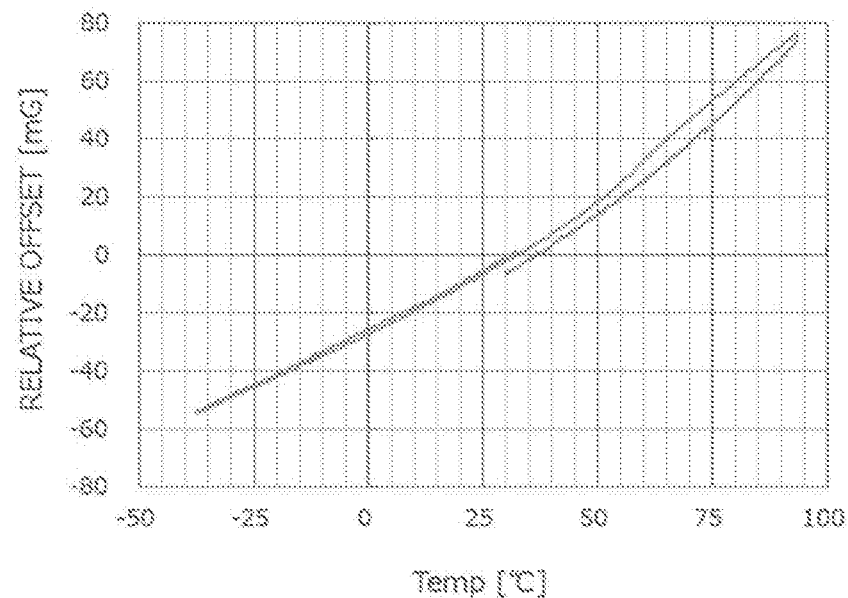
FIG. 9B is a graph illustrating a temperature hysteresis measurement result of a configuration of a physical quantity sensor in the related art.
Figure 9C:
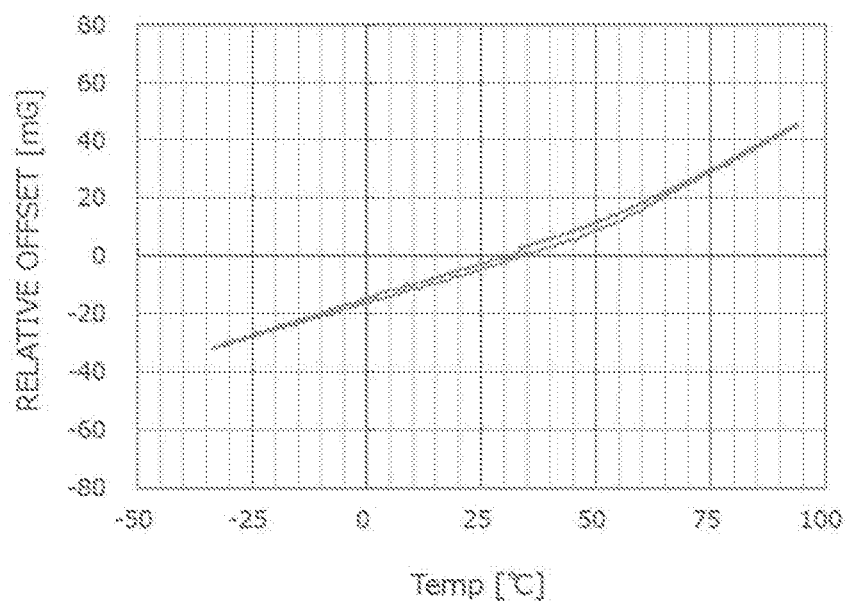
FIG. 9C is a graph illustrating a temperature hysteresis measurement result of a physical quantity sensor according to the invention.

Next, a temperature hysteresis and noise characteristics of the physical quantity sensor 1 according to the first embodiment will be described with reference to FIGS. 9A, 9B, and 9C. FIG. 9A is a graph illustrating a temperature profile for measuring a temperature hysteresis of the physical quantity sensor, FIG. 9B is a graph illustrating a temperature hysteresis measurement result of a configuration of a physical quantity sensor in the related art, and FIG. 9C is a graph illustrating a temperature hysteresis measurement result of a physical quantity sensor according to the invention.

Temperature Hysteresis

A so-called temperature hysteresis, which indicates restorability (presence or absence of difference of zero point output value at the same temperature) of output values (zero point output value at no load) at each temperature at the time of temperature increase and temperature decrease according to the physical quantity sensor 1 of the present embodiment is measured by the temperature profile illustrated in FIG. 9A. A temperature of the physical quantity sensor 1 set in thermostatic chamber is first decreased from 30° C. to about −40° C., increased to around 90° C., and decreased to 30° C., and results of measuring the output values of each temperature are illustrated in FIGS. 9B and 9C. FIG. 9B is a temperature hysteresis of the configuration in the related art in which the GND plane 30 is disposed on the inner bottom surface 11h facing the acceleration sensor element 20 via the resin adhesive 18, and FIG. 9C is a temperature hysteresis of the physical quantity sensor 1 (configuration that the GND plane 30 is apart from the inner bottom surface 11h) of the present embodiment.

The temperature hysteresis (FIG. 9B) of the configuration in the related art shows a large difference between the output value at the time of temperature increase from about 30° C. to about 90° C. and the output value at the time of temperature decrease from around 90° C. to around 30° C. On the other hand, the temperature hysteresis (FIG. 9C) of the configuration of the physical quantity sensor 1 according to the present embodiment shows a small difference of the output values at the time of temperature increase and at the time of temperature decrease between around 30° C. and around 90° C., and thereby the temperature hysteresis is decreased. By adopting a configuration in which the GND plane 30 is apart from (displaced from) the inner bottom surface 11h of the package 7, it is possible to make the unevenness and the distortion of the GND plane 30 surface caused by residual stress resulting from a difference in a linear expansion coefficient between the GND plane 30 and the first base material 11 are hard to be propagated to the acceleration sensor element 20 disposed on the inner bottom surface 11h, and thereby the physical quantity sensor 1 with a small temperature hysteresis can be achieved.

Noise Characteristics

It was proved that, on the noise characteristics measured by mounting the physical quantity sensor 1 of the present embodiment on an inspection socket, an average value 30 ug/√Hz of 20 Hz to 50 Hz became the same between the value measured by mounting the physical quantity sensor 1 on the inspection socket and the value measured by mounting the physical quantity sensor 1 on a circuit substrate (substrate 315), and there was no deterioration of noise. That is, the inspection socket is not affected by the radiation noise generated from the circuit substrate (substrate 315), and since the GND plane 30 is disposed so as to overlap with the acceleration sensor element 20 in the plan view, it can be said that the radiation noise that affects the acceleration sensor element 20 from the first base material 11 side can be shut off with the GND plane 30. Therefore, it is possible to obtain the physical quantity sensor 1 capable of reducing the influence of the radiation noise from the outside of the package 7.

According to the physical quantity sensor 1 according to the first embodiment, since the GND plane 30 is provided apart from the inner bottom surface 11h sandwiching the substrates 11b and 11c in-between, the surface of the GND plane 30 does not come into contact with the acceleration sensor element 20. For this reason, it is possible to make the unevenness and the distortion on a surface of the GND plane 30 caused by residual stress resulting from a difference in a linear expansion coefficient between the GND plane 30 and the first base material 11 hard to be propagated to the acceleration sensor element 20 disposed on the inner bottom surface 11h, and the temperature hysteresis of the physical quantity sensor 1 can be reduced.

Since the GND plane 30 is disposed so as to overlap with the acceleration sensor element 20 from the plan view, and the radiation noise from outside of the package 7 affecting the acceleration sensor element 20 from the first base material 11 side can be shut off with the GND plane 30, the influence of the radiation noise can be reduced.

The lid 15 with conductivity and the GND plane 30 are provided on the first base material 11, the second base material 12, and the third base material 13, and are electrically connected to the communicating through-holes 11g, 12g, and 13g filled with the conductor 32, respectively. Since the radiation noise from the outside of the package 7 affecting the acceleration sensor element 20 from the lid 15 side of the package 7 and the first base material 11 side can be shut off with the lid 15 and the GND plane 30, the influence of the radiation noise can be further reduced.

By increasing the width L1 of the analog wiring 34a formed in the package 7 wider than width L2 of the signal wiring 34b, or by increasing the width L1 of the analog wiring 34a twice or more of the width L2 of the signal wiring 34b, it is possible to decrease the impedance of the analog wiring 34a, and reduce the influence of radiation noise from the outside of the package 7.

In the above-described first embodiment, in the acceleration sensor element 20 as a sensor element, an example of a configuration storing three sensor units of the X axis sensor unit 21x, the Y axis sensor unit 21y, and the Z axis sensor unit 21z in the container 25 is described. However, three sensor units may not necessarily be stored in the acceleration sensor element, and can be an acceleration sensor element capable of measuring one axis or two axes according to the requirement of the use. Hereinafter, with reference to FIGS. 10 and 11, acceleration sensor elements of Application 1 and Application 2 will be described.

Application 1

Figure 10:
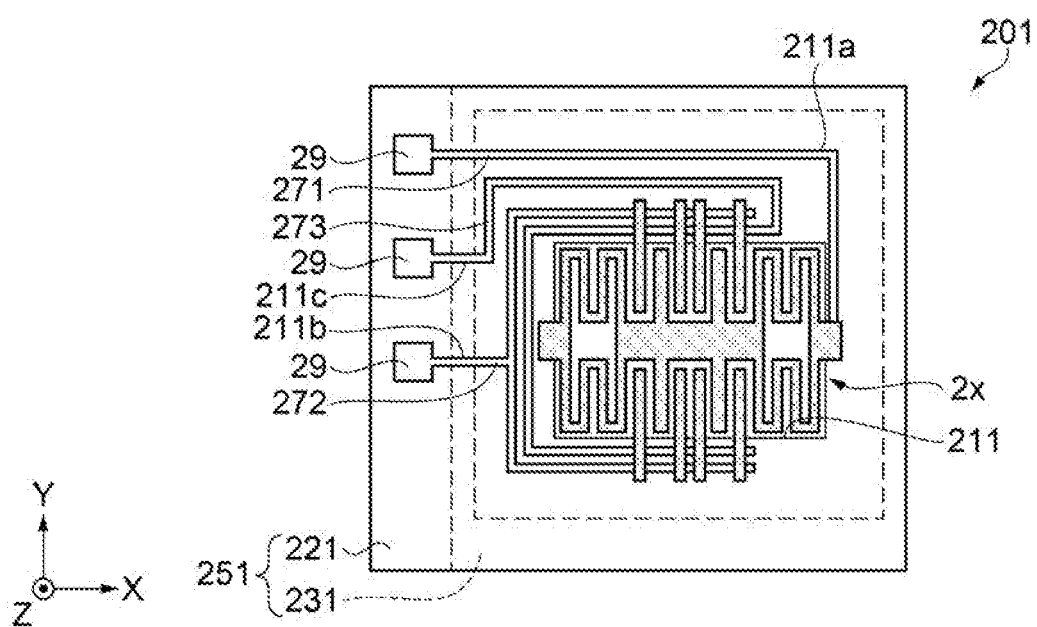
FIG. 10 is a plan view illustrating a schematic configuration of Application 1 of an acceleration sensor element.

First, Application 1 of the acceleration sensor element will be described with reference to FIG. 10. FIG. 10 is a plan view illustrating Application 1 of a sensor element.

As illustrated in FIG. 10, an acceleration sensor element 201 according to Application 1 includes a single sensor unit 2x. The sensor unit 2x is a portion that measures acceleration in an axis direction. Such a sensor unit 2x has the same configuration as that of the X axis sensor unit 21x described in FIGS. 6 and 8A. Therefore, a detailed description will be omitted. The sensor unit 2x is airtightly stored in the container 251 having the base substrate 221 and the cap portion 231 similar to the first embodiment. In such an acceleration sensor element 201, acceleration in one axis direction can be measured.

In the acceleration sensor element 201, the description is made using the sensor unit 2x having the same configuration as that of the X axis sensor unit 21x. However, a configuration that any similar sensor unit to the Y axis sensor unit 21y or the Z axis sensor unit 21z is airtightly stored in the container 251 may be adopted.

Application 2

Figure 11:
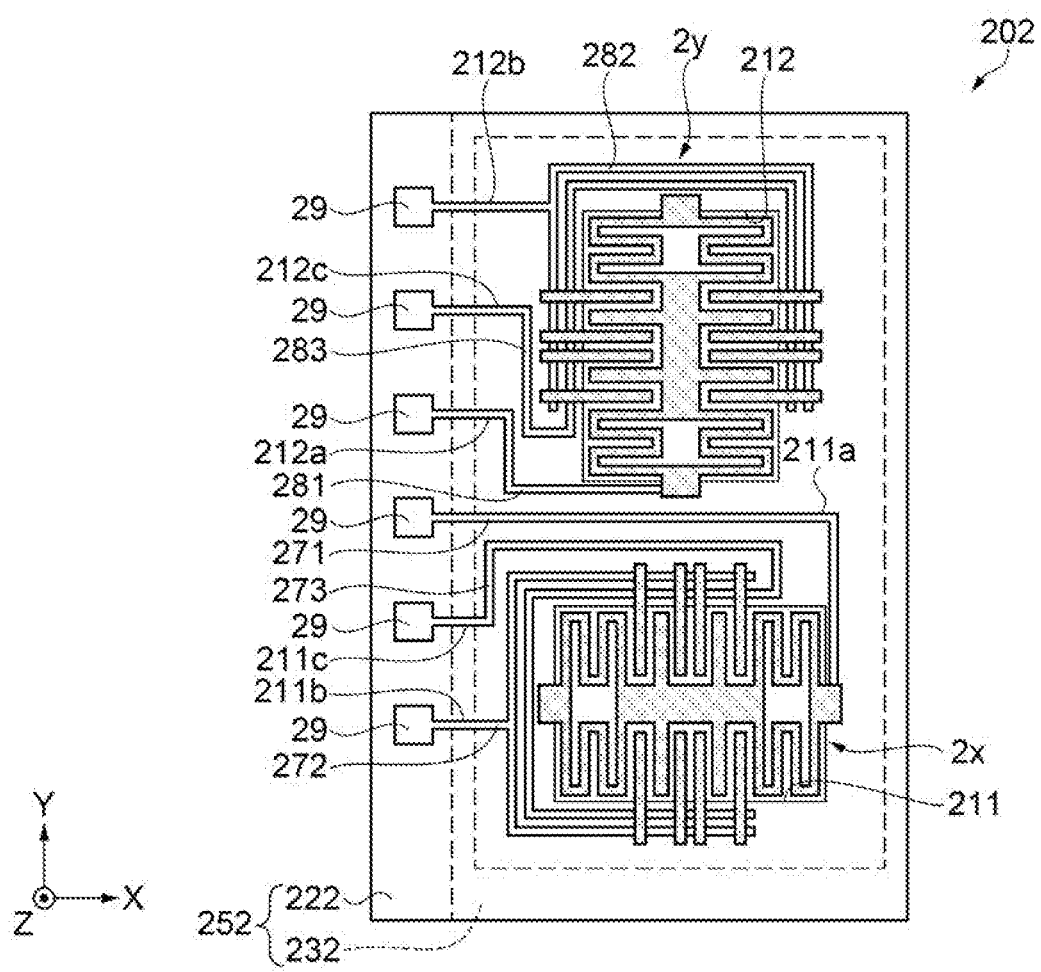
FIG. 11 is a plan view illustrating a schematic configuration of Application 2 of the acceleration sensor element.

Next, Application 2 of an acceleration sensor element will be described with reference to FIG. 11. FIG. 11 is a plan view illustrating Application 2 of a sensor element.

As illustrated in FIG. 11, an acceleration sensor element 202 according to Application 2 has two sensor units 2x and 2y. The sensor unit 2x is a portion that measures acceleration in an axis direction (X axis direction in the present example). Such a sensor unit 2x has the same configuration as that of the X axis sensor unit 21x described in FIGS. 6 and 8A. A sensor unit 2y is a portion that measures acceleration in an axis direction (Y axis direction in the present example). Such a sensor unit 2y has the same configuration as that of the Y axis sensor unit 21y described in FIGS. 6 and 8B. Therefore, a detailed description will be omitted. The sensor unit 2x and the sensor unit 2y are airtightly stored in the container 252 having the base substrate 222 and the cap portion 232 and having the same configuration as that of the first embodiment. In such an acceleration sensor element 202, acceleration in two axis directions (X axis direction and Y axis direction in the present example) can be measured.

In Application 2, an example capable of measuring acceleration in two axis directions, the X axis direction and the Y axis direction, is described. The invention is not limited to this, and a configuration in which a sensor unit similar to the Z axis sensor unit 21z described in FIGS. 6 and 8C is combined may be adopted. For example, a configuration capable of measuring acceleration in the X axis direction and the Z axis direction or the Y axis direction and the Z axis direction may be adopted.

A physical quantity sensor storing the acceleration sensor element 201 capable of measuring in one axis or the acceleration sensor element 202 capable of measuring in two axes as illustrated in Application 1 and Application 2 can be obtained.

Second Embodiment

Next, a physical quantity sensor according to the second embodiment will be described with reference to FIG. 12.

Figure 12:
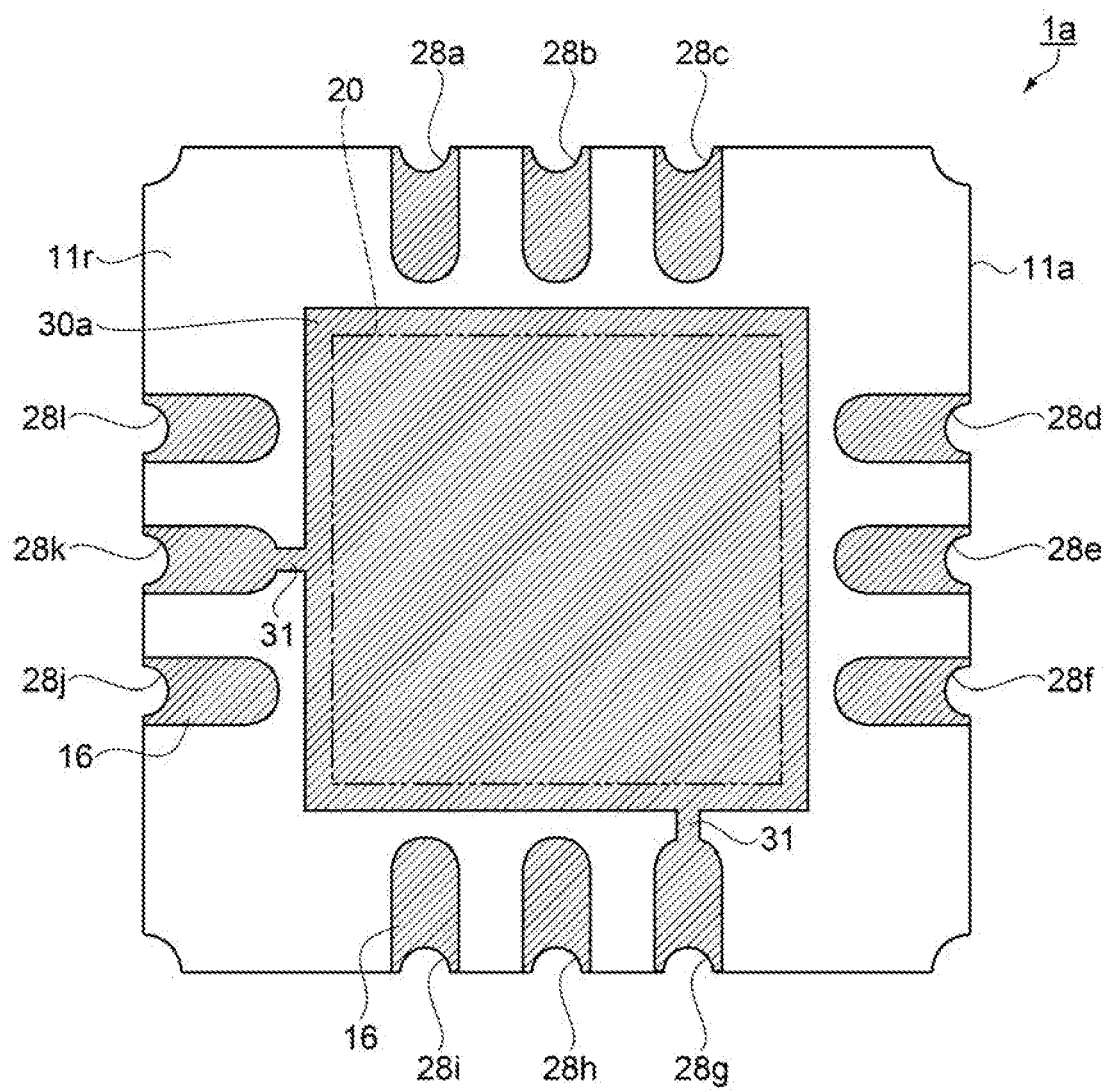
FIG. 12 is a plan view illustrating a schematic configuration of a physical quantity sensor according to a second embodiment.

FIG. 12 is a plan view illustrating a schematic configuration of a physical quantity sensor according to a second embodiment. FIG. 12 is a plan view seeing from an outer bottom surface side, and corresponds to a rear surface of a package. Hereinafter, the description will be focused on the differences from the above-described first embodiment, and the description of similar matters will be omitted.

A physical quantity sensor 1a according to the second embodiment has a different disposal position of a GND plane 30a compared with the physical quantity sensor 1 according to the first embodiment. While the GND plane 30 of the physical quantity sensor 1 according to the first embodiment is provided on the upper surface 11j of the substrate 11a, the GND plane 30a of the physical quantity sensor 1a according to the second embodiment is provided on the outer bottom surface 11r of the substrate 11a.

As illustrated in FIG. 12, in the physical quantity sensor 1a of the present embodiment, the GND plane 30a is provided on the outer bottom surface 11r of the substrate 11a, and is disposed at a position overlapping the acceleration sensor element 20 in the plan view. The GND plane 30a is electrically connected to the external terminals 16 contacting the castellations 28g and 28k by a connecting portion (connector) 31.

According to the physical quantity sensor 1a according to the second embodiment, similar to the first embodiment, the GND plane 30a is provided apart from the inner bottom surface 11h of the package 7 sandwiching the substrates 11a, 11b, and 11c in between. For this reason, the unevenness and the distortion on the GND plane 30a surface caused by residual stress resulting from a difference in a linear expansion coefficient between the GND plane 30a and the first base material 11 as a bottom plate are hardly propagated to the acceleration sensor element 20, and a temperature hysteresis resulting from the residual stress can be reduced. Since the GND plane 30a is disposed at a position overlapping the acceleration sensor element 20 in the plan view, the influence of the radiation noise from the outside of the package 7 can be reduced, and highly accurate acceleration data can be achieved.

Third Embodiment

Figure 13:
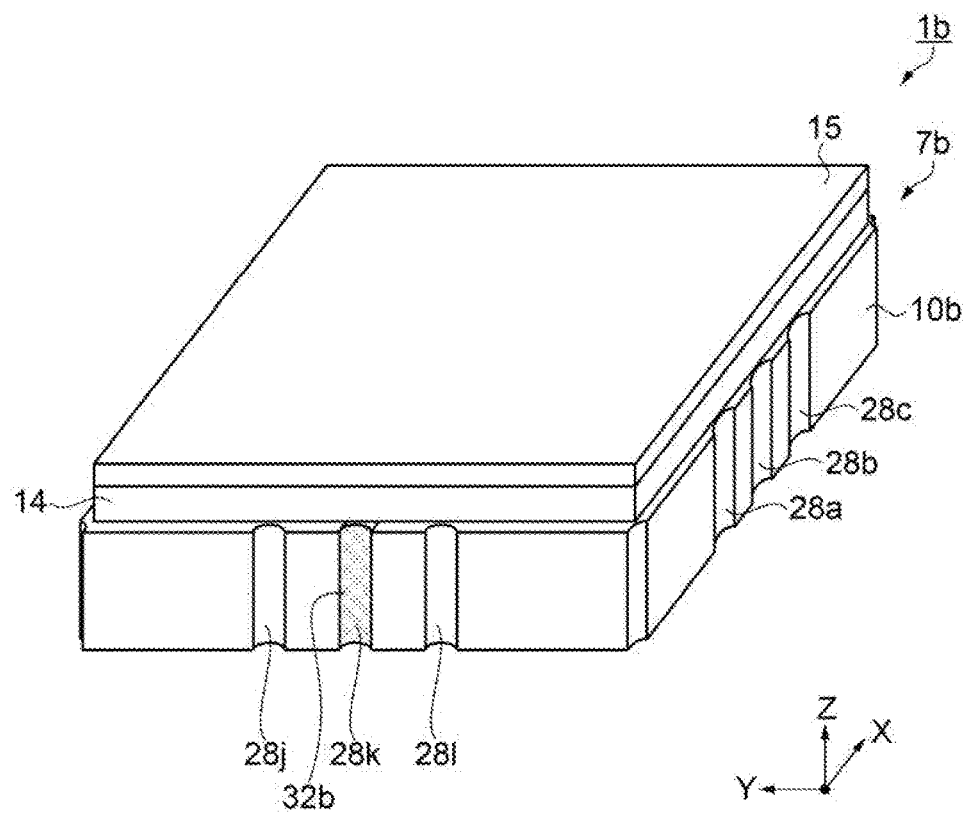
FIG. 13 is a perspective view illustrating a schematic configuration of a physical quantity sensor according to a third embodiment.

Next, a physical quantity sensor according to the third embodiment will be described with reference to FIG. 13. FIG. 13 is a perspective view illustrating a schematic configuration of a physical quantity sensor according to the third embodiment. Hereinafter, the description will be focused on the differences from the above-described first embodiment, and the description of similar matters will be omitted.

A physical quantity sensor 1b according to the third embodiment has a different method of electrically connecting the lid 15 and the GND plane 30 compared with the physical quantity sensor 1 according to the first embodiment. The lid 15 of the physical quantity sensor 1 and the GND plane 30 according to the first embodiment are provided on the first base material 11, the second base material 12, and the third base material 13, and are electrically connected to the through-holes 11g, 12g, and 13g filled with the conductor 32, respectively. On the other hand, the lid 15 of the physical quantity sensor 1b and the GND plane 30 according to the third embodiment are electrically connected to the castellation 28k provided on a side surface of the package 7b via a conductive layer 32b formed by metalizing a metallic material and the like.

As illustrated in FIG. 13, in the physical quantity sensor 1b of the present embodiment, the conductive layer 32b formed by metalizing a metallic material is provided in the castellation 28k provided on a side surface of the package 7b to electrically connect the lid 15 and the GND plane 30. The lid 15 and the GND plane 30 can be set to the same potential, and the influence of the radiation noise from the lid 15 side and the first base material 11 side can be reduced with the lid 15 and the GND plane 30.

According to the physical quantity sensor 1b according to the third embodiment, similar to the first embodiment, since the GND plane 30 is disposed apart from the inner bottom surface 11h of the package 7, the temperature hysteresis resulting from the residual stress can be reduced. Since the lid 15 and the GND plane 30 are electrically connected via conductive layer 32b formed in the castellation 28k, the influence of the radiation noise from the outside of the package 7 can be reduced.

Fourth Embodiment

Figure 14:
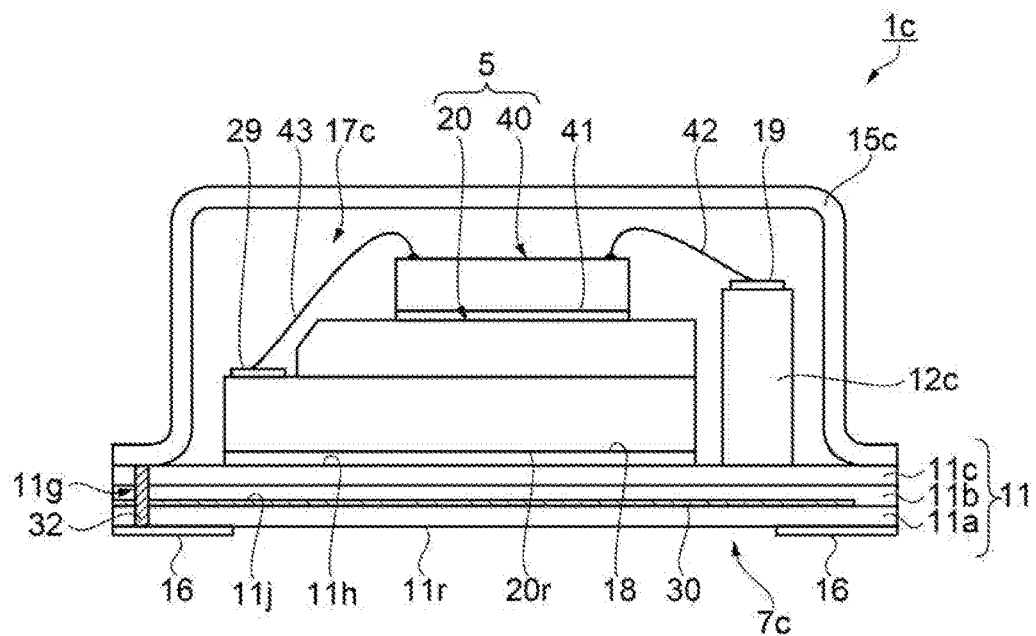
FIG. 14 is a sectional view illustrating a schematic configuration of a physical quantity sensor according to a fourth embodiment.

Next, a physical quantity sensor according to the fourth embodiment will be described with reference to FIG. 14. FIG. 14 is a sectional view illustrating a schematic configuration of a physical quantity sensor according to a fourth embodiment. Hereinafter, the description will be focused on the differences from the above-described first embodiment, and the description of similar matters will be omitted.

A physical quantity sensor 1c according to the fourth embodiment has a different configuration of the package 7c compared with the physical quantity sensor 1 according to the first embodiment. The package 7c of the physical quantity sensor 1c according to the fourth embodiment is configured with the flat first base material 11 and the lid 15c including the storage space 17c while the package 7 of the physical quantity sensor 1 of the first embodiment is configured with the base 10 including the storage space 17 and the flat lid 15.

As illustrated in FIG. 14, in the physical quantity sensor 1c of the present embodiment, the GND plane 30 is provided between the substrate 11a and the substrate 11b and is bonded to the acceleration sensor element 20 constituting the structure body 5 via the resin adhesive 18 on an upper surface (inner bottom surface 11h) of the substrate 11c. The IC 40 is bonded on an upper surface of the acceleration sensor element 20 via the adhesive 41. An electrode pad (not illustrated) of the IC 40 and the internal terminal 19 disposed on an upper surface of a pedestal 12c provided in the first base material 11 are electrically connected via the bonding wire 42.

The lid 15c is composed of a material having conductivity such as metal and has a recess constituting the storage space 17c that is a storage portion on the first base material 11 side, and the structure body 5 is stored in the storage space 17c. The first base material 11 and the lid 15c are bonded by a bonding member (not illustrated) such as solder or a conductive adhesive in a region in contact with each outer edge. Therefore, the structure body 5 can be shut off from the atmosphere of the outside of the package 7c, and the compact physical quantity sensor 1c with high quality can be achieved. In the first base material 11, the through-hole 11g penetrating the substrates 11a, 11b, 11c is provided at a position overlapping with the GND plane 30 in the plan view, and the conductor 32 is filled in the through-hole 11g. The lid 15c and the GND plane 30 provided on the upper surface 11j of the substrate 11a are electrically connected by the conductor 32. The lid 15c and the GND plane 30 can be set to the same potential, and the influence of the radiation noise from the outside of the package 7c can be reduced.

According to the physical quantity sensor 1c according to the fourth embodiment, similar to the first embodiment, since the GND plane 30 is disposed apart from an upper surface (inner bottom surface 11h) of the substrate 11c of the first base material 11, the temperature hysteresis resulting from the residual stress can be reduced. Since the lid 15c and the GND plane 30 are electrically connected to each other via conductor 32 filled in the through-hole 11g, the influence of the radiation noise from the outside of the package 7c can be reduced.

Fifth Embodiment

Figure 15:
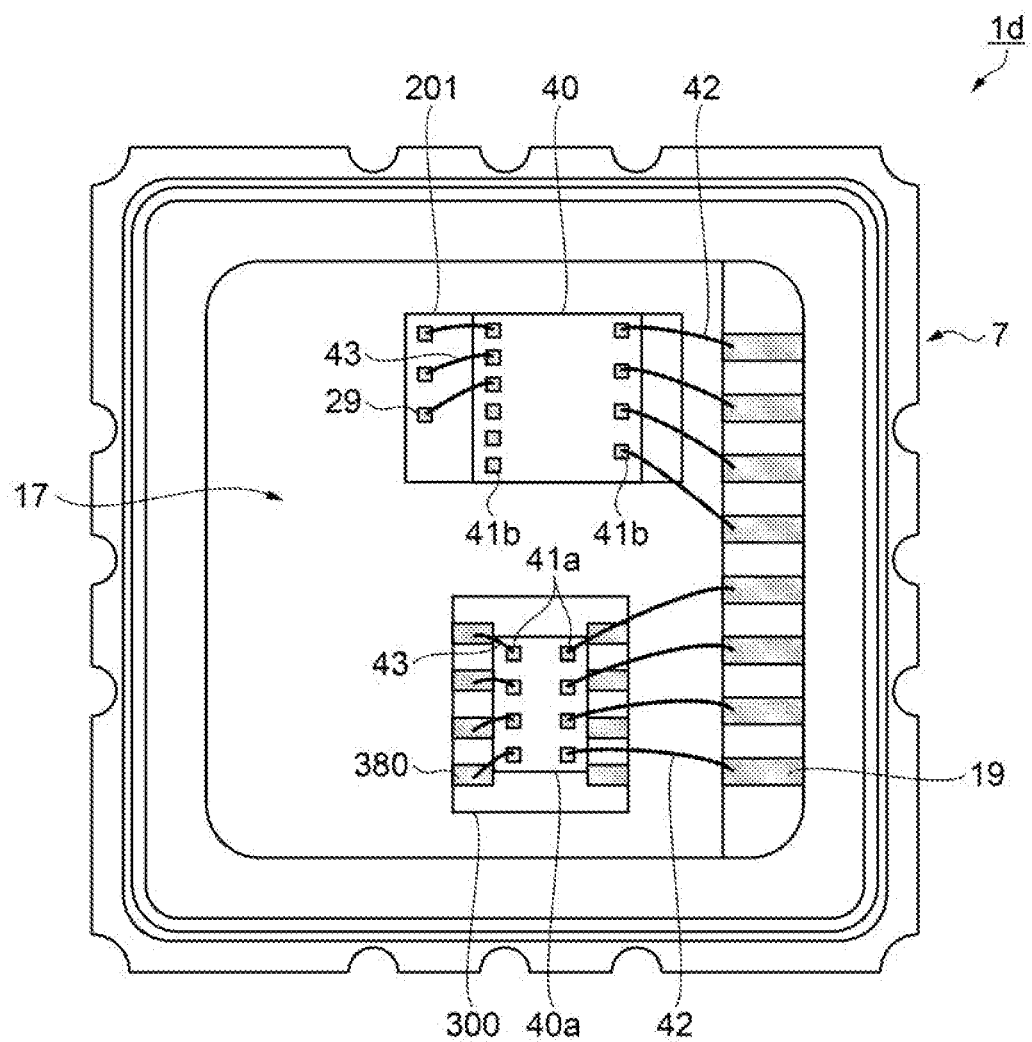
FIG. 15 is a plan view illustrating a schematic configuration of a physical quantity sensor according to a fifth embodiment.
Figure 15:
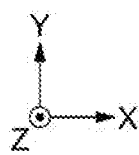

Next, a physical quantity sensor according to the fifth embodiment will be described with reference to FIG. 15. FIG. 15 is a plan view illustrating a schematic configuration of a physical quantity sensor according to a fifth embodiment. For the sake of convenience of explanation, the lid is omitted in FIG. 15. Hereinafter, the description will be focused on the differences from the above-described first embodiment, and the description of similar matters will be omitted.

A physical quantity sensor 1d according to the fifth embodiment has a different configuration of a sensor element stored in the storage space 17 of the package 7 compared with the physical quantity sensor 1 according to the first embodiment. In the storage space 17 of the package 7 of the physical quantity sensor 1 according to the first embodiment, the acceleration sensor element 20 capable of measuring 3 axes and the IC 40 are stored. On the other hand, in the physical quantity sensor 1d according to the fifth embodiment, the acceleration sensor element 201 capable of measuring in one axis (X axis) according to Application 1, the IC 40 that controls the acceleration sensor element 201, an angular velocity sensor element 300 capable of measuring in one axis (Z axis), and an IC 40a that controls the angular velocity sensor element 300 are stored in the storage space 17 of the package 7 similar to the first embodiment.

As illustrated in FIG. 15, the physical quantity sensor 1d of the present embodiment stores the acceleration sensor element 201 capable of measuring one axis and the angular velocity sensor element 300 capable of measuring one axis in the storage space 17 of the package 7, and can be used as a complex sensor including an acceleration sensor capable of measuring acceleration of one axis and an angular velocity sensor capable of measuring angular velocity of one axis.

The physical quantity sensor 1d is provided with the acceleration sensor element 201, the IC 40 disposed on the acceleration sensor element 201, the angular velocity sensor element 300, and the IC 40a provided on the angular velocity sensor element 300 in the package 7. In the IC 40 that controls the acceleration sensor element 201, an electrode pad 41b provided on upper surface of the IC 40 is electrically connected to the internal terminal 19 provided on the package 7 via the bonding wire 42 and is electrically connected to the connection terminal 29 disposed on the acceleration sensor element 201 via the bonding wire 43. In the IC 40a that controls the angular velocity sensor element 300, an electrode pad 41a provided on an upper surface of the IC 40a is electrically connected to the internal terminal 19 provided on the package 7 via the bonding wire 42 and is electrically connected to a connection terminal 380 provided on the angular velocity sensor element 300 via the bonding wire 43. Thereby, it is possible to measure the acceleration in the X axis and the angular velocity in the Z axis.

In the present embodiment, the physical quantity sensor 1d including the acceleration sensor element 201 that measures one axis of the X axis and the angular velocity sensor element 300 that measures one axis of the Z axis is described as an example, but the invention is not limited to this. A combination of a one-axis acceleration sensor element that measures any one of measurement axes of the X axis, the Y axis, and the Z axis and a one-axis angular velocity sensor element that measures any one of measurement axes of the X axis, the Y axis, and the Z axis may be used.

According to the physical quantity sensor 1d according to the fifth embodiment, since the acceleration sensor element 201 and the angular velocity sensor element 300 are included in the package 7 similar to the first embodiment, the temperature hysteresis resulting from the residual stress and an influence of the radiation noise from the outside of the package 7 can be reduced, and the physical quantity sensor 1d as a complex sensor capable of measuring the acceleration in one axis and an angular velocity in one axis can be achieved.

Angular Velocity Sensor Element 300

Figure 16A:
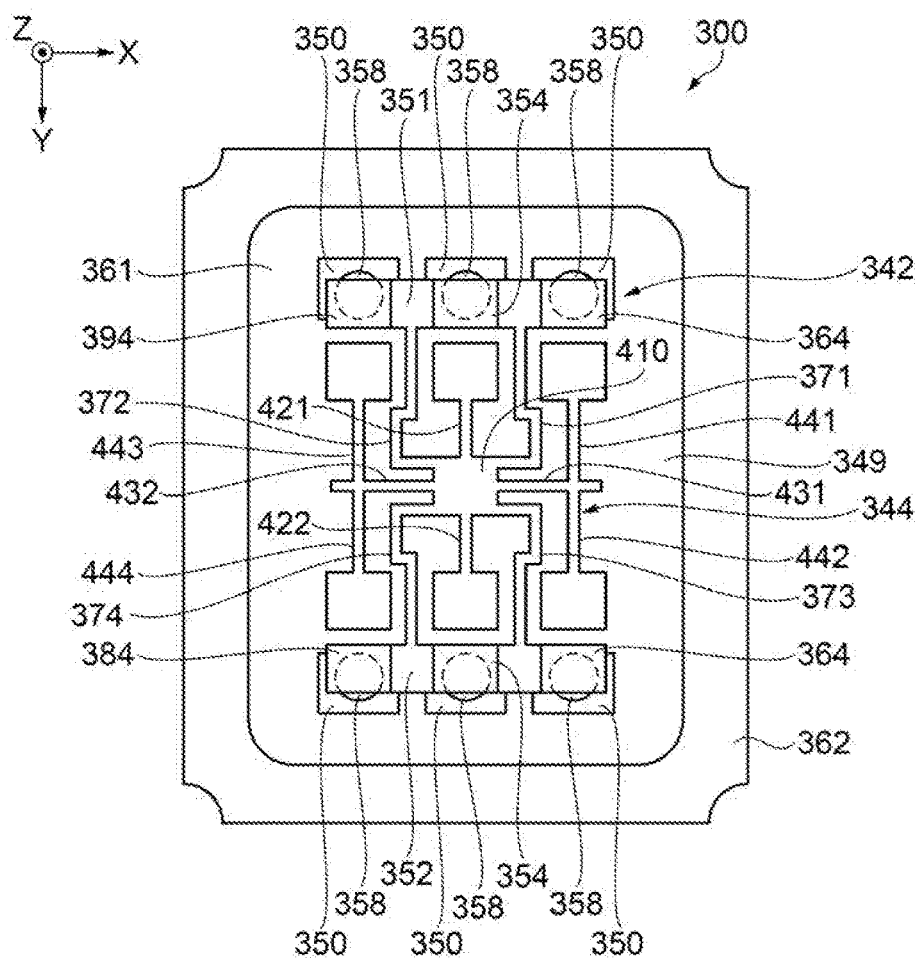
FIG. 16A is a plan view illustrating an example of an angular velocity sensor element.
Figure 16B:
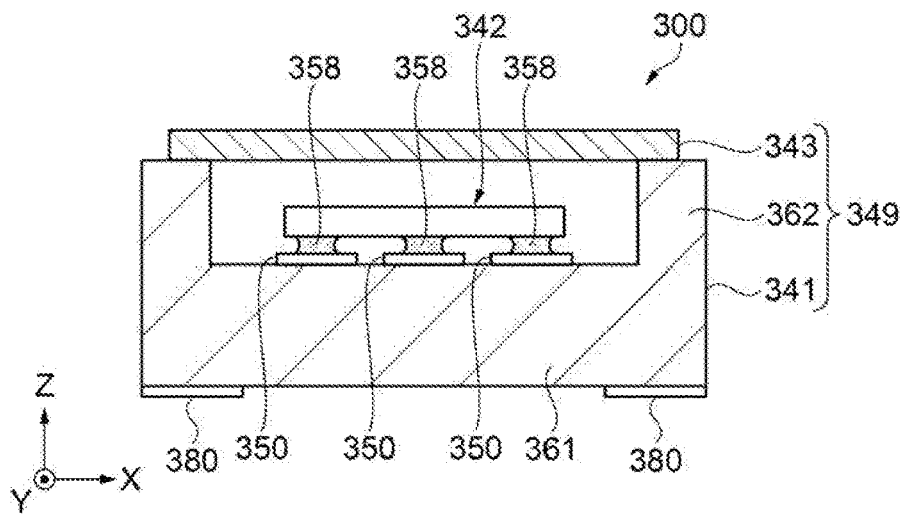
FIG. 16B is a sectional view of FIG. 16A illustrating the angular velocity sensor element.

Here, an example of an angular velocity sensor element will be described with reference to FIGS. 16A and 16B. FIG. 16A is a plan view illustrating an example of an angular velocity sensor element used in a physical quantity sensor. For the sake of convenience of explanation, the lid is omitted in FIG. 16A. FIG. 16B is a cross-sectional view of FIG. 16A illustrating the angular velocity sensor element.

The angular velocity sensor element 300 illustrated in FIGS. 16A and 16B includes a gyro element 342 and a package 349 that stores the gyro element 342. Hereinafter, the gyro element 342 and the package 349 will be described in detail.

FIG. 16A illustrates the gyro element 342 seen from an upper side (lid 343 side). A measurement signal electrode, a measurement signal wiring, a measurement signal terminal, a measurement ground electrode, a measurement ground wiring, a measurement ground terminal, a drive signal electrode, a drive signal wiring, a drive signal terminal, a drive ground electrode, a drive ground wiring, a drive ground terminal, and the like are provided in the gyro element 342, but omitted in FIG. 16A.

The gyro element 342 is an "out-of-plane measurement type" sensor that measures angular velocity around the Z axis. Although not illustrated, the gyro element 342 is configured with a base material, a plurality of electrodes, wirings, and terminals provided on a surface of the base material. The gyro element 342 can be made of a piezoelectric material such as crystal, lithium tantalate, lithium niobate or the like, and among these, it is preferable to be constituted of crystal. Thereby, the gyro element 342 capable of exhibiting excellent oscillation characteristics (frequency characteristics) can be achieved.

Such a gyro element 342 includes a so-called double T type oscillation body 344, a first support portion 351 and a second support portion 352 as a support portion that supports the oscillation body 344, a first coupling beam 371 and a second coupling beam 372 that couple the oscillation body 344 and the first support portion 351, and a third coupling beam 373 and a fourth coupling beam 374 that couple the oscillation body 344 and the second support portion 352.

The oscillation body 344 has a spread in the XY plane, and has a thickness in the Z axis direction. Such an oscillation body 344 includes a base 410 positioned in a center, a first measurement oscillation arm 421 and a second measurement oscillation arm 422 extending to both sides along the Y axis direction from the base 410, a first coupling arm 431 and a second coupling arm 432 extending to both sides along the X axis direction from the base 410, a first drive oscillation arm 441 and a third drive oscillation arm 442 extending to both sides along the Y axis direction from a tip end portion of the first coupling arm 431, and a second drive oscillation arm 443 and a fourth drive oscillation arm 444 extending to both sides along the Y axis direction from a tip end portion of the second coupling arm 432.

The first drive oscillation arm 441 and the third drive oscillation arm 442 may extend from middle of an extending direction of the first coupling arm 431, and similarly, the second drive oscillation arm 443 and the fourth drive oscillation arm 444 may also extend from middle of an extending direction of the second coupling arm 432. In the present embodiment, a configuration that the first drive oscillation arm 441 and the third drive oscillation arm 442 and the second drive oscillation arm 443 and the fourth drive oscillation arm 444 are extending from the first coupling arm 431 and the second coupling arm 432 extending from the base 410 is described. However, a base may include the base 410, the first coupling arm 431, and the second coupling arm 432. That is, a configuration that a first drive oscillation arm, a second drive oscillation arm, a third drive oscillation arm, and a fourth drive oscillation arm extending from a base may be adopted.

The gyro element 342 with the above-described configuration measures angular velocity w around the Z axis as follows. In a state that the angular velocity w is not applied, when an electric field is generated between a drive signal electrode (not illustrated) and a drive ground electrode (not illustrated), each drive oscillation arm 441, 443, 442, and 444 of the gyro element 342 performs bending oscillation in the X axis direction. In this state of performing the drive oscillation, when angular velocity is applied to the gyro element 342 around the Z axis, oscillation in the Y axis direction is generated. That is, when Coriolis force is applied to the drive oscillation arms 441, 443, 442 and 444 and the coupling arms 431 and 432 in the Y axis direction, measurement oscillation of the measurement oscillation arms 421 and 422 is excited in the X axis direction in response to the oscillation. The angular velocity can be achieved by the measurement signal electrode (not illustrated) and the measurement ground electrode (not illustrated) measuring the distortion of the measurement oscillation arms 421 and 422 generated by this oscillation.

The package 349 storing the gyro element 342 will be described. The package 349 stores the gyro element 342. In the package 349, an IC chip that performs drive of the gyro element 342 and the like may be stored in addition to the gyro element 342. Such a package 349 has a substantially rectangular shape in the plan view (in XY plan view).

The package 349 includes a base 341 having a recess portion opening on upper surface and a lid 343 that is bonded to the base so as to close the opening of the recess portion. The base 341 also includes a plate-shaped bottom plate 361 and a frame-shaped side wall 362 provided at an upper peripheral edge of the bottom plate 361. Such a package 349 has a storage space therein, and the gyro element 342 is airtightly stored and disposed in the storage space.

The gyro element 342 is fixed on an upper surface of the bottom plate 361 via a conductive fixed member 358 such as solder and a conductive adhesive (adhesive material in which a conductive filler such as silver metal particles is dispersed in a resin material) in the first support portion 351 and the second support portion 352. Since the first support portion 351 and the second support portion 352 are positioned on both end portions of the gyro element 342 in the Y axis direction, by fixing such a portion to the bottom plate 361, the oscillation body 344 of the gyro element 342 is supported at both ends and the gyro element 342 can be stably fixed to the bottom plate 361.

Six conductive fixed members 358 are provided (in contact with) corresponding to two measurement signal terminals 364, two measurement ground terminals 354, a drive signal terminal 384 and a drive ground terminal 394 provided in the first support portion 351 and the second support portion 352 and are apart from each other. Six connection pads 350 corresponding to the two measurement signal terminals 364, the two measurement ground terminals 354, the drive signal terminal 384 and the drive ground terminal 394 are provided on an upper surface of the bottom plate 361, and each of these connection pads 350 is electrically connected to any one of the corresponding terminals via the conductive fixed member 358. The connection pad 350 is electrically connected to the connection terminal 380 via an internal wiring (not illustrated), a through electrode and the like.

According to the angular velocity sensor element 300 having such a configuration, it is possible to efficiently and highly accurately measure the required angular velocity in the one axis direction.

Sixth Embodiment

Figure 17:
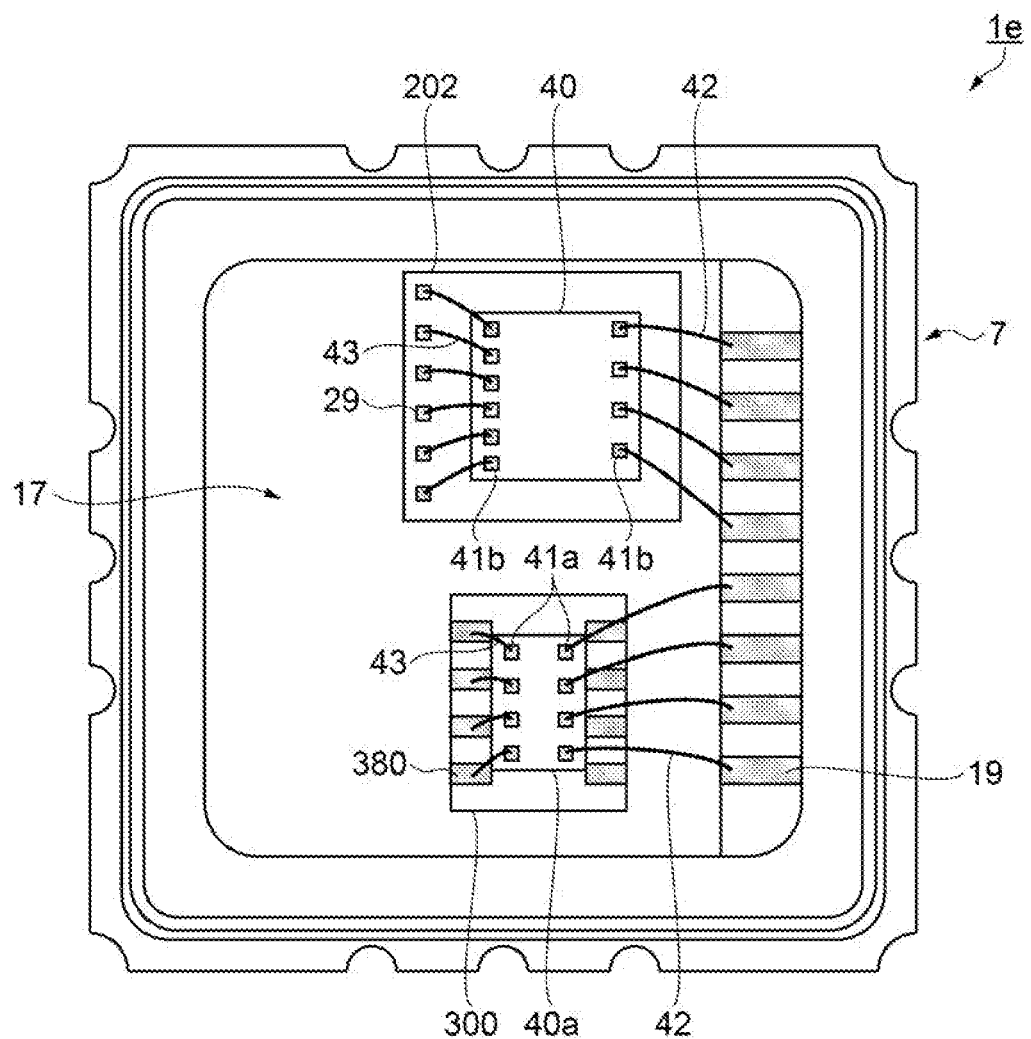
FIG. 17 is a plan view illustrating a schematic configuration of a physical quantity sensor according to a sixth embodiment.

Next, a physical quantity sensor according to the sixth embodiment will be described with reference to FIG. 17. FIG. 17 is a plan view illustrating a schematic configuration of the physical quantity sensor according to a sixth embodiment. For the sake of convenience of explanation, the lid is omitted in FIG. 17. Hereinafter, the description will be focused on the differences with the above-described first embodiment, and the description of similar matters will be omitted.

A physical quantity sensor 1e according to the sixth embodiment has a different configuration of a sensor element stored in the storage space 17 of the package 7 compared with the physical quantity sensor 1 according to the first embodiment. In the storage space 17 of the package 7 of the physical quantity sensor 1 according to the first embodiment, the acceleration sensor element 20 capable of measuring 3 axes and the IC 40 are stored. On the other hand, the physical quantity sensor 1e according to the sixth embodiment stores the acceleration sensor element 202 capable of measuring two axes (X axis and Y axis) according to the above-described Application 2, the IC 40 that controls the acceleration sensor element 202, the angular velocity sensor element 300 capable of measuring the above-described one axis (Z axis), and the IC 40a that controls the angular velocity sensor element 300 in the storage space 17 of the package 7 similar to the first embodiment.

As illustrated in FIG. 17, the physical quantity sensor 1e of the present embodiment stores the acceleration sensor element 202 capable of measuring two axes and the angular velocity sensor element 300 capable of measuring one axis in the storage space 17 of the package 7, and can be used as a complex sensor including an acceleration sensor capable of measuring acceleration in two axes and an angular velocity sensor capable of measuring angular velocity of one axis.

The physical quantity sensor 1e includes the acceleration sensor element 202 and the IC 40 disposed on the acceleration sensor element 202, the angular velocity sensor element 300 and the IC 40a provided on the angular velocity sensor element 300 in the package 7. In the IC 40 that controls the acceleration sensor element 202, an electrode pad 41b provided on upper surface of the IC 40 is electrically connected to the internal terminal 19 provided on the package 7 via a bonding wire 42 and is electrically connected to the connection terminal 29 disposed on the acceleration sensor element 202 via a bonding wire 43. In the IC 40a that controls the angular velocity sensor element 300, an electrode pad 41a provided on an upper surface of the IC 40a is electrically connected to the internal terminal 19 provided on the package 7 via the bonding wire 42 and is electrically connected to a connection terminal 380 provided on the angular velocity sensor element 300 via the bonding wire 43. Thereby, it is possible to measure the acceleration in the X axis and the Y axis and the angular velocity in the Z axis.

In the present embodiment, the physical quantity sensor 1e including the acceleration sensor element 202 that measures two axes of the X axis and the Y axis and the angular velocity sensor element 300 that measures one axis of the Z axis is described as an example, but the invention is not limited to this. A combination of a two-axis acceleration sensor element that measures any two axes of measurement axes of the X axis, the Y axis, and the Z axis, and a one-axis angular velocity sensor element that measures any one of measurement axes of the X axis, the Y axis, and the Z axis may be used.

According to the physical quantity sensor 1e according to the sixth embodiment, since the acceleration sensor element 202 and the angular velocity sensor element 300 are included in the package 7 similar to that in the first embodiment, the temperature hysteresis resulting from the residual stress and the influence of the radiation noise from the outside of the package 7 can be reduced, and the physical quantity sensor 1e as a complex sensor capable of measuring the acceleration in two axes and the angular velocity in one axis can be achieved.

In the above-described embodiment, as a complex sensor which is an example of a physical quantity sensor, the physical quantity sensor 1d (fifth embodiment) that includes the acceleration sensor element 201 capable of measuring acceleration in one axis (X axis) and the angular velocity sensor element 300 capable of measuring angular velocity in one axis (Z axis) and the physical quantity sensor 1e (sixth embodiment) including the acceleration sensor element 202 capable of measuring acceleration in 2 axes (X axis and Y axis) and the angular velocity sensor element 300 capable of measuring angular velocity in one axis (Z axis) are described. Besides this, a complex sensor in combination of a one-axis acceleration sensor element that measures any one of measurement axes of the X axis, the Y axis, and the Z axis, a two-axis angular velocity sensor element that measures any two of measurement axes of the X axis, the Y axis, and the Z axis, and a three-axis angular velocity sensor element that measures three axes of the X axis, the Y axis, and the Z axis may be used. A complex sensor in combination of a two-axis acceleration sensor element that measures any two axes of measurement axes of the X axis, the Y axis, and the Z axis, a two-axis angular velocity sensor element that measures any two of measurement axes of the X axis, the Y axis, and the Z axis, and a three-axis angular velocity sensor element that measures three axes of the X axis, the Y axis, and the Z axis may be used. A complex sensor in combination of a three-axis acceleration sensor element that measures three measurement axes of the X axis, the Y axis, and the Z axis, a one-axis angular velocity sensor element that measures any one of measurement axes of the X axis, the Y axis, and the Z axis, a two-axis angular velocity sensor element that measures any two of measurement axes of the X axis, the Y axis, and the Z axis, and a three-axis angular velocity sensor element that measures three axes of the X axis, the Y axis, and the Z axis may be used.

Seventh Embodiment

Figure 18:
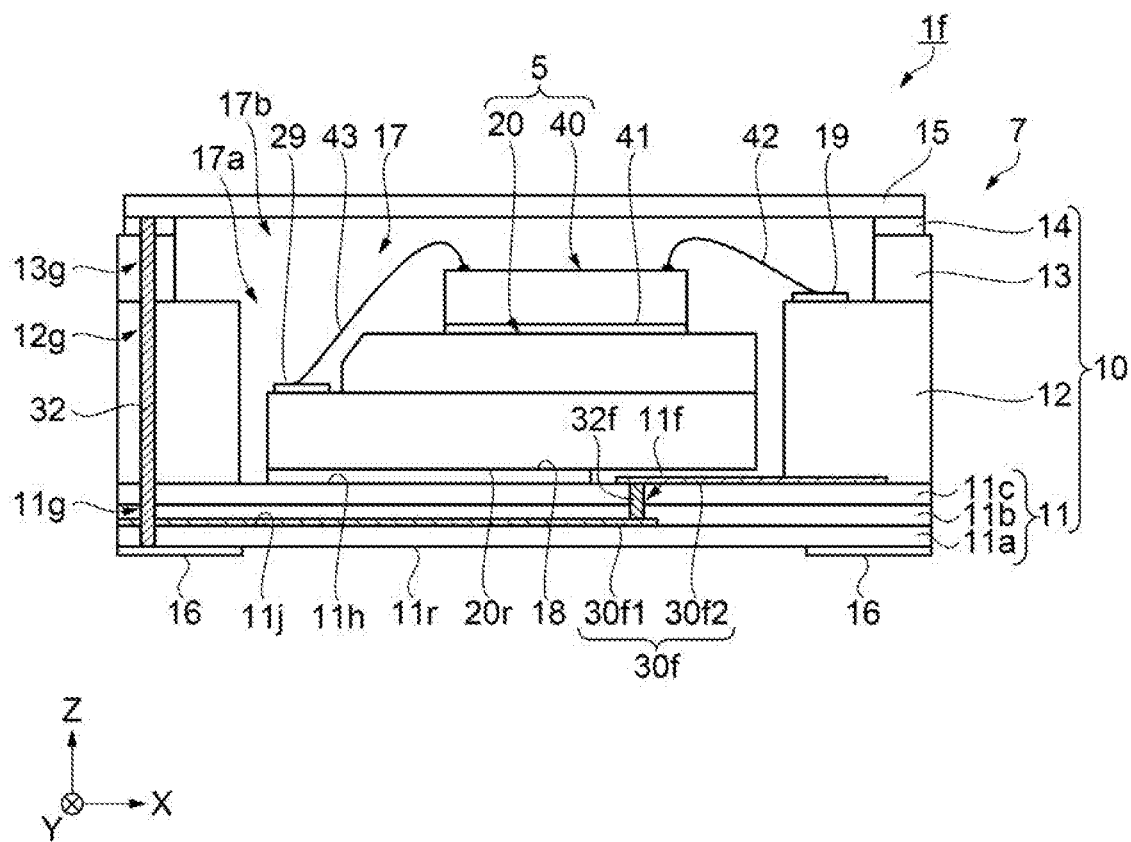
FIG. 18 is a sectional view illustrating a schematic configuration of a physical quantity sensor according to a seventh embodiment.

Next, a physical quantity sensor according to the seventh embodiment will be described with reference to FIG. 18. FIG. 18 is a sectional view illustrating a schematic configuration of a physical quantity sensor according to a seventh embodiment. Hereinafter, the description will be focused on the differences with the above-described first embodiment, and the description of similar matters will be omitted.

A physical quantity sensor if according to the seventh embodiment has a different configuration of a GND plane 30f compared with the physical quantity sensor 1 according to the first embodiment. The GND plane 30 of the physical quantity sensor 1 in the first embodiment is provided between the substrate 11a and the substrate lib. On the other hand, the GND plane 30f of the physical quantity sensor if according to the seventh embodiment is provided between the substrate 11a and the substrate 11b, and provided on the inner bottom surface 11h which is an upper surface of the substrate 11c.

As illustrated in FIG. 18, the structure body 5 is adhered (bonded) to the inner bottom surface 11h of the package 7 by the resin adhesive 18 from the connection terminal 29 side to a central portion of the structure body in the physical quantity sensor if of the present embodiment.

The GND plane 30f is configured by a GND plane 30f1 provided in a region overlapping with an adhesion region of the resin adhesive 18 adhered to the inner bottom surface 11h between the substrate 11a and the substrate 11b, and a GND plane 30f2 provided in a region not overlapping with an adhesion region of the resin adhesive 18 adhered to the inner bottom surface 11h on the inner bottom surface 11h that is an upper surface of the substrate 11c in a plan view from a direction in which the acceleration sensor element 20 and the package 7 overlap.

The GND plane 30f1 and the GND plane 30f2 are electrically connected by the conductor 32f filled in a through-hole 11f provided on the substrates 11b and 11c.

Since the GND plane 30f1 is provided apart from the inner bottom surface 11h in the region overlapping with an adhesion region of the resin adhesive 18, it is possible to make the unevenness and the distortion on a GND plane 30f1 surface caused by residual stress resulting from a difference in a linear expansion coefficient between the GND plane 30f1 and a bottom plate 11 hard to be propagated to the acceleration sensor element 20 disposed on the inner bottom surface 11h, and the temperature hysteresis of the physical quantity sensor if can be reduced.

Since the region not overlapping with an adhesion region of the resin adhesive 18 is provided with the GND plane 30f2, the radiation noise from the outside of the package 7 can be shut off with the GND plane 30f1 and the GND plane 30f2, and influence of the radiation noise can be reduced.

According to the physical quantity sensor if according to the seventh embodiment, similar to the first embodiment, since the GND plane 30f is provided apart from the inner bottom surface 11h of the package 7, the unevenness and the distortion due to residual stress on the GND plane 30f is hardly propagated to the acceleration sensor element 20 and a temperature hysteresis resulting from the residual stress can be reduced. Since the GND plane 30f is disposed at a position overlapping with the acceleration sensor element 20 in the plan view, the influence of the radiation noise from the outside of the package 7 can be reduced, and highly accurate acceleration data can be achieved.

Inertial Measurement Unit

Figure 19:
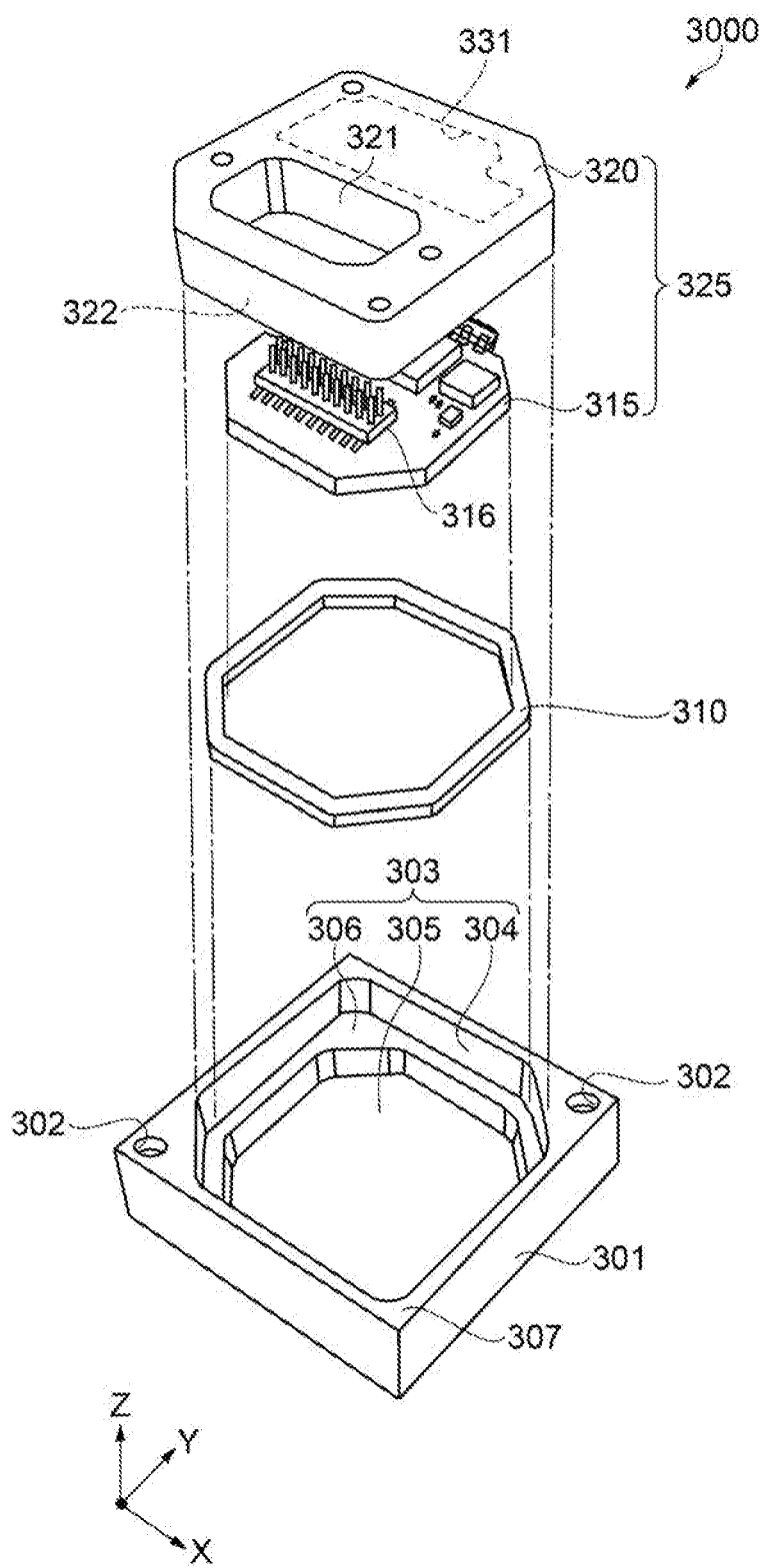
FIG. 19 is a disassembled perspective view illustrating a schematic configuration of an inertial measurement unit.
Figure 20:
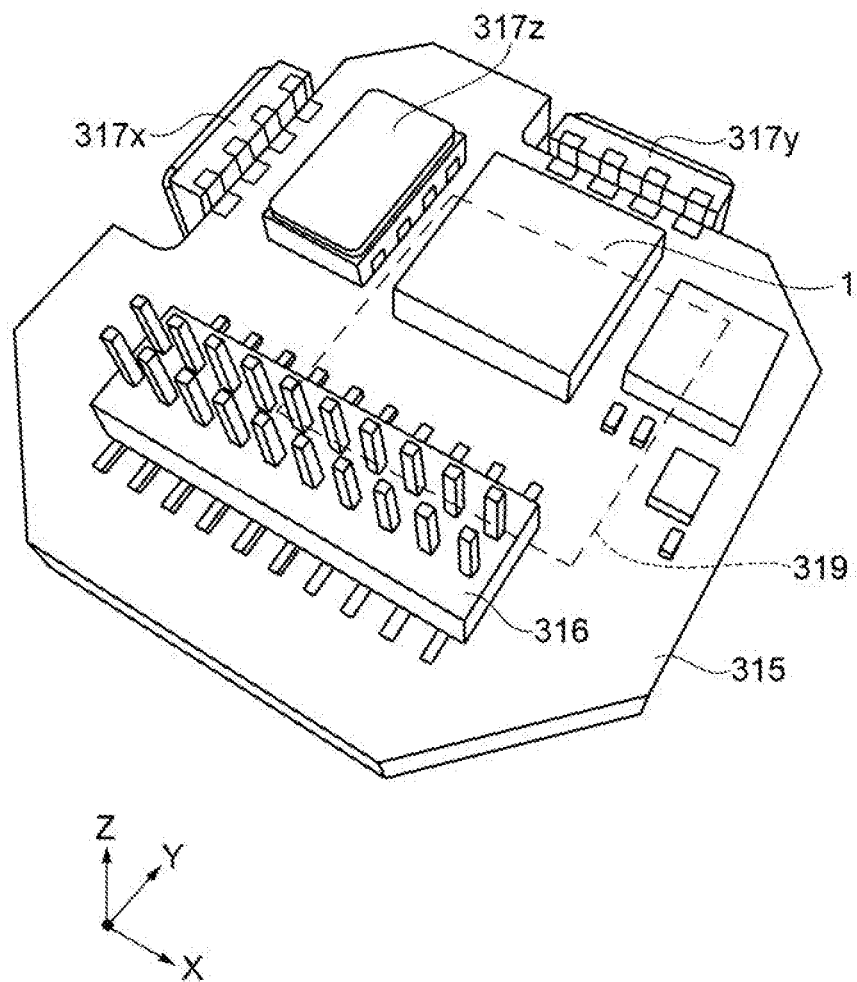
FIG. 20 is a perspective view illustrating a disposal example of an inertial sensor element of the inertial measurement unit.

Next, an inertial measurement unit (IMU) will be described with reference to FIGS. 19 and 20. FIG. 19 is a disassembled perspective view illustrating a schematic configuration of an inertial measurement unit, and FIG. 20 is a perspective view illustrating a disposal example of inertial sensor elements of the inertial measurement unit.

As illustrated in FIG. 19, an inertial measurement unit 3000 is configured with a sensor module 325 including an outer case 301, a bonding member 310, and an inertial sensor element. In other words, the sensor module 325 is engaged (inserted) in an inner portion 303 of the outer case 301 with the bonding member 310 interposed therebetween. The sensor module 325 is configured with an inner case 320 and the substrate 315. To make the explanation easier to understand, although the site names are defined as the outer case and the inner case, it may be called the first case and the second case.

The outer case 301 is a pedestal from which aluminum is cut out into a box shape. The material is not limited to aluminum, and other metals such as zinc and stainless steel, resin, or a composite material of metal and resin may be used. The outer shape of the outer case 301 is a rectangular parallelepiped having a substantially square planar shape similar to the overall shape of the above-described inertial measurement unit 3000, and screw holes 302 are formed in the vicinity of two apexes positioned in a diagonal direction of the square, respectively. The invention is not limited to the screw hole 302. For example, a configuration in which a notch (structure in which a notch is formed at a corner portion of the outer case 301 where the screw hole 302 is positioned) that can be screwed by screws is formed and screwed, or a configuration in which a flange (ears) is formed on the side surface of the outer case 301 and the flange portion is screwed may be adopted. However, in a case where the former notch hole is screwed as a fixing portion, if the notch of the notch hole is larger than a screw diameter, the screw slips out of the notch and becomes oblique when screwing, and there is a possibility that the fixing of the screwing tends to be easily removed or the notched hole part of the outer case is deformed or scraped off by the miss-crewed screw. In the case of providing a notch hole as the fixing portion, it is preferable to provide the notch of the notch hole to be smaller than the diameter of the screw.

The outer case 301 has a rectangular parallelepiped and box-like shape without a lid, and the inner portion 303 (inside) thereof is an internal space (container) surrounded by a bottom wall 305 and a side wall 304. In other words, the outer case 301 has a box shape having one surface facing the bottom wall 305 as an opening surface, the sensor module 325 is stored so as to cover most of the opening portion of the opening surface (so as to close the opening portion), and the sensor module 325 is exposed from the opening portion (not illustrated). Here, the opening surface facing the bottom wall 305 is the same surface as the upper surface 307 of the outer case 301. The planar shape of the inner portion 303 of the outer case 301 is a hexagon obtained by chamfering corners of two apex portions of a square, the two chamfered apex portions correspond to the positions of the screw holes 302. In the cross-sectional shape (thickness direction) of the inner portion 303, the inner portion 303, that is, a first bonding surface 306 as a bottom wall one step higher than the central portion is formed in the peripheral portion in the inner the bottom wall 305. That is, the first bonding surface 306 is a part of the bottom wall 305, is a single step-like site portion formed in a ring shape surrounding the central portion of the bottom wall 305 in plan view, and is a surface with a smaller distance from the opening surface (same surface as upper surface 307) than the bottom wall 305.

An example in which the outer shape of the outer case 301 is a rectangular parallelepiped having a substantially square planar shape and a box shape without a lid is described. However, the invention is not limited to this. The planar shape of the outer shape of the outer case 301 may be, for example, a polygon such as a hexagon or an octagon, the corners of the apex portions of the polygon may be chamfered or may be a planar shape in which each side is a curved line. The planar shape of the inner portion 303 (inside) of the outer case 301 is not limited to the above-mentioned hexagon, and it may be a rectangle (tetragon) such as a square or another polygonal shape such as an octagon. The outer shape of the outer case 301 and the planar shape of the inner portion 303 may be similar or may not be similar figures.

The inner case 320 is a member that supports the substrate 315 and has a shape to fit in the inner portion 303 of the outer case 301. Specifically, in a plan view, the shape thereof is a hexagon that the corners of the two apex portions of the square are chamfered, and an opening portion 321 that is a rectangular through-hole and a recess portion 331 that is provided on the surface that supports the substrate 315 are formed therein. The two chamfered apex portions correspond to the positions of the screw holes 302 of the outer case 301. The height in the thickness direction (Z axis direction) is lower than the height from an upper surface 307 of the outer case 301 to the first bonding surface 306. In the preferred example, the inner case 320 is also formed by scraping out aluminum, but other materials may be used like the outer case 301.

Guide pins and supporting faces (not illustrated) for positioning the substrate 315 are formed on a rear surface (surface on the side of outer case 301) of the inner case 320. The substrate 315 is set (positioned and installed) on the guide pin and the support surface and adheres to the rear surface of the inner case 320. Details of the substrate 315 will be described later. The peripheral edge portion of the rear surface of the inner case 320 is a second bonding surface 322 formed of a ring-shaped flat surface. The second bonding surface 322 has a planar shape substantially similar to that of the first bonding surface 306 of the outer case 301 in the plan view, and when the inner case 320 is set on the outer case 301, the two surfaces face each other with the bonding member 310 sandwiched therebetween. The configurations of the outer case 301 and the inner case 320 are one example, and the invention is not limited to this structure.

A configuration of the substrate 315 on which an inertial sensor is mounted will be described with reference to FIG. 20. As illustrated in FIG. 20, the substrate 315 is a multilayer substrate having a plurality of through-holes formed therein, and a glass epoxy substrate is used as the substrate 315. It is not limited to a glass epoxy substrate, and any rigid substrate capable of mounting a plurality of inertial sensors, electronic components, connectors and the like may be used. For example, a composite substrate or a ceramic substrate may be used.

On a surface of the substrate 315 (surface on the side of the inner case 320), a connector 316, an angular velocity sensor 317z, the physical quantity sensor 1 as an acceleration sensor, and the like are mounted. The connector 316 is a plug type (male) connector, and has two rows of connection terminals disposed at an equal pitch in the X axis direction. Preferably, connection terminals of 20 pins in total (10 pins in one row) is used. However, the number of terminals may be appropriately changed according to design specifications.

An angular velocity sensor 317z as an inertial sensor is a gyro sensor that measures angular velocity of one axis in the Z axis direction. As a preferred example, an oscillating gyro sensor which uses crystal as an oscillator and measures angular velocity from the Coriolis force applied to an oscillating object is used. It is not limited to an oscillating gyro sensor but may be a sensor capable of measuring angular velocity. For example, a sensor using ceramics or silicon as the oscillator may be used.

On the side surface of the substrate 315 in the X axis direction, an angular velocity sensor 317x for measuring the angular velocity of one axis in the X axis direction is mounted so that the mounting surface (installation surface) is orthogonal to the X axis. Similarly, on the side surface in the Y axis direction of the substrate 315, an angular velocity sensor 317y for measuring the angular velocity of one axis in the Y axis direction is mounted so that the mounting surface (installation surface) is orthogonal to the Y axis.

The angular velocity sensor elements 300 described with reference to FIGS. 16A and 16B can be used as the angular velocity sensors 317x, 317y, and 317z. The invention is not limited to a configuration using three angular velocity sensors for each axis but may be any sensor capable of measuring the angular velocity of three axes. For example, a sensor device capable of measuring (detecting) angular velocities of three axes with one device (package) as in the physical quantity sensor 1 described later may be used.

The physical quantity sensor 1 similar to that described in the first embodiment is bonded to the package (see FIG. 2) using the resin adhesive 18 (see FIG. 2) using an electrostatic capacitance type acceleration sensor element 20 (for example, see FIG. 5) in which, for example, a silicon substrate is processed by a MEMS technology, which can measure (detect) acceleration in three directions (three axes) of the X axis, the Y axis, and the Z axis in a single device. A physical quantity sensor to which the acceleration sensor element 202 capable of measuring acceleration in two axis directions of the X axis and the Y axis or the acceleration sensor element 201 capable of measuring acceleration in one axis direction is applied can be used if necessary.

A control IC 319 as a control unit (controller) for controlling the physical quantity sensor 1 and the three angular velocity sensors 317x, 317y, and 317z is mounted on the rear surface (surface on the outer case 301 side) of the substrate 315. The control IC 319 is a micro controller unit (MCU) incorporates a storage unit including a nonvolatile memory, an A/D converter, and the like, and controls each portion of the inertial measurement unit 3000. The storage unit stores a program that defines the order and contents for measuring acceleration and angular velocity, a program that digitizes measurement data and incorporates the measured data into packet data, accompanying data, and the like. A plurality of electronic components are mounted on the substrate 315.

According to such an inertial measurement unit 3000, since the physical quantity sensor 1 of the first embodiment in which the acceleration sensor element 20 mounted on the package 7 (See FIG. 2) is used, the temperature hysteresis at the output of the acceleration data, which is caused by the heat treatment such as mounting the inertia measuring unit 3000 can be reduced. Therefore, it is possible to provide the inertial measurement unit 3000 with enhanced reliability.

Electronic Apparatus

Next, electronic apparatuses using the physical quantity sensors 1, 1*a*, 1*b*, 1*c*, 1*d*, 1*e*, and 1*f* will be described in detail with reference to FIGS. 21 to 24B. Hereinafter, an example using the physical quantity sensor 1 will be described.

Figure 21:
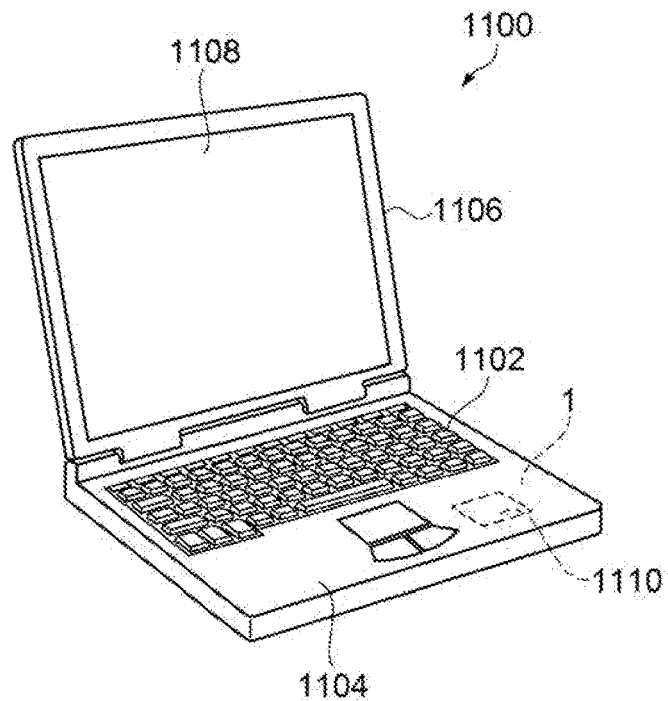
FIG. 21 is a perspective view schematically illustrating a configuration of a mobile personal computer which is an example of an electronic apparatus.

First, a mobile type personal computer which is an example of an electronic apparatus will be described with reference to FIG. 21. FIG. 21 is a perspective view schematically illustrating a configuration of a mobile personal computer which is an example of an electronic apparatus.

In FIG. 21, a personal computer 1100 is configured with a main body portion 1104 having a keyboard 1102 and a display unit 1106 having a display portion 1108, and the display unit 1106 is rotatably supported relative to the main body portion 1104 via a hinge structure portion. In such a personal computer 1100, the physical quantity sensor functioning as an acceleration sensor is incorporated, and a control unit 1110 can perform control such as attitude control based on the measurement data of the physical quantity sensor 1. Since such a personal computer 1100 is provided with a temperature sensor (not illustrated) and a correction unit (not illustrated) for correcting the temperature of the measurement signal measured by the physical quantity sensor 1, it is possible to perform control such as attitude control with higher accuracy.

Figure 22:
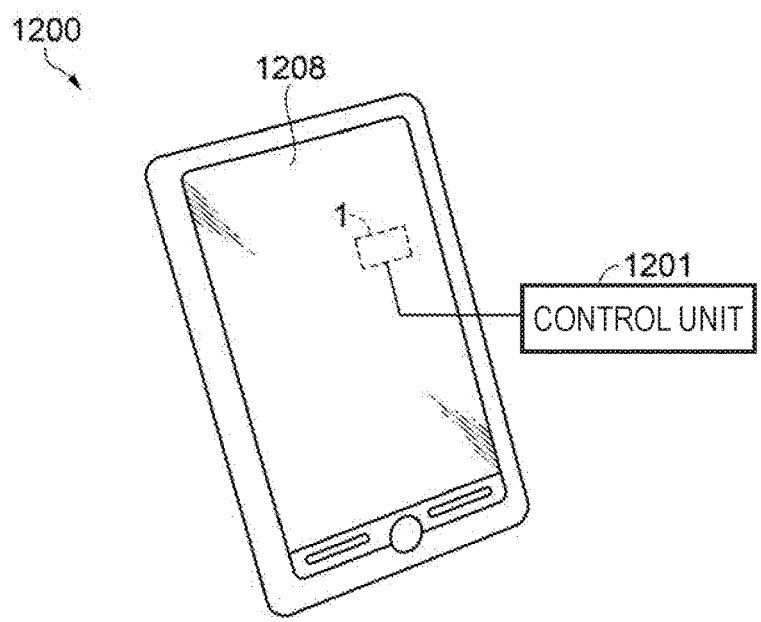
FIG. 22 is a perspective view schematically illustrating a configuration of a smart phone (portable telephone) which is an example of an electronic apparatus.

Next, a smart phone (mobile phone) which is an example of an electronic apparatus will be described with reference to FIG. 22. FIG. 22 is a perspective view schematically illustrating a configuration of a smart phone (portable telephone) which is an example of an electronic apparatus.

In FIG. 22, a smart phone 1200 has the physical quantity sensor 1 incorporated therein. The measurement signal (acceleration data) measured by the physical quantity sensor 1 is transmitted to a control unit 1201 of the smart phone 1200. The control unit 1201 includes a central processing unit (CPU). The control unit 1201 can recognize the attitude and behavior of the smart phone 1200 from the received measurement signal, changes the display image displayed on a display portion 1208, sounds an alarm sound or effect sound, or drives the oscillation motor to oscillate the main body. In other words, motion sensing of the smart phone 1200 can be performed, and display contents can be changed, sounds, oscillations, and the like can be generated from the measured attitudes and behaviors. In particular, in the case of executing an application of a game, it is possible to enjoy realistic feeling close to reality. Since such a smart phone 1200 is provided with a temperature sensor (not illustrated) and a correction unit (not illustrated) for correcting the temperature of the measurement signal measured by the physical quantity sensor 1, it is possible to perform control such as attitude control with higher accuracy.

Figure 23:
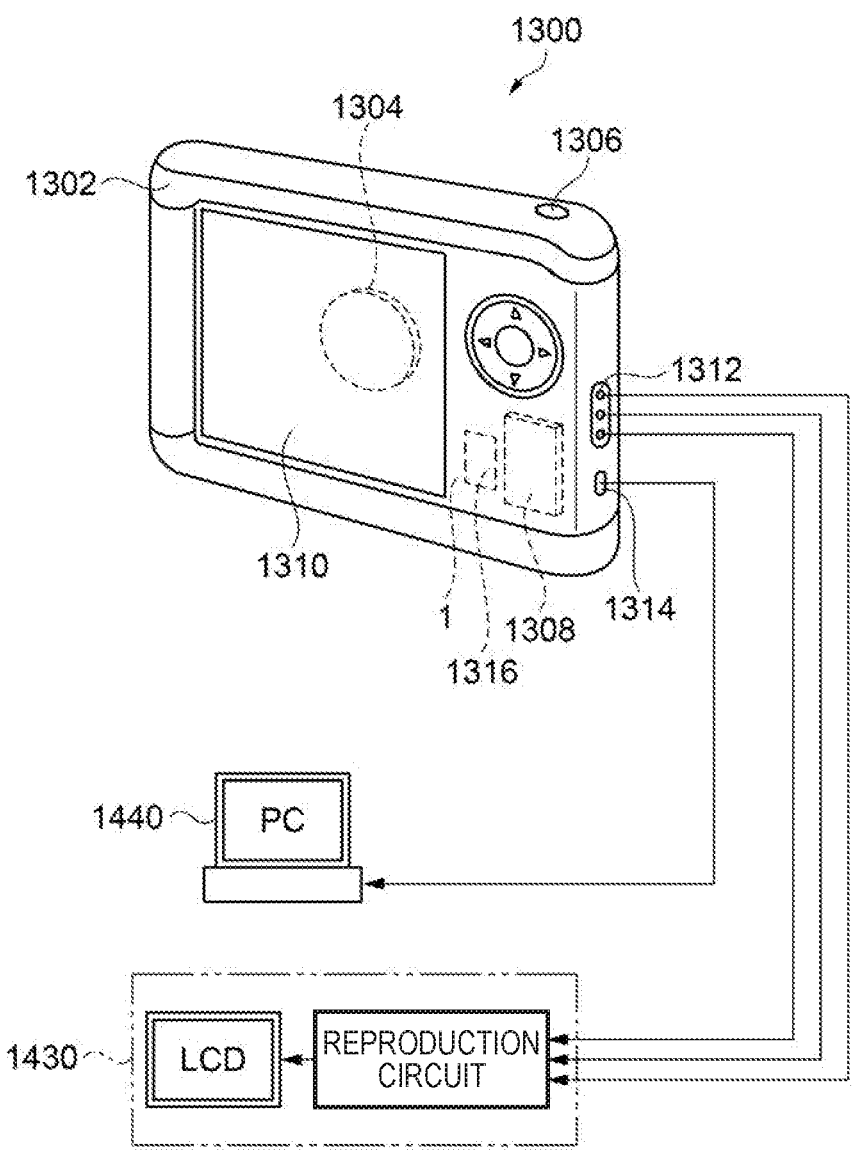
FIG. 23 is a perspective view illustrating a configuration of a digital still camera which is an example of an electronic apparatus.

Next, a digital still camera which is an example of an electronic apparatus will be described with reference to FIG. 23. FIG. 23 is a perspective view illustrating a configuration of a digital still camera which is an example of an electronic apparatus. In FIG. 23, connections with external devices are also illustrated briefly.

A display portion 1310 is provided on a back surface of a case (body) 1302 of a digital still camera 1300, and display is performed based on an image pickup signal by a CCD. The display portion 1310 also functions as a finder that displays the subject as an electronic image. A light receiving unit 1304 including an optical lens (image pickup optical system) and a CCD or the like is provided on the front side (rear side in the drawing) of the case 1302.

When a photographer checks the subject image displayed on the display portion 1310 and presses a shutter button 1306, the image pickup signal of the CCD at that time is transferred and stored in a memory 1308. The digital still camera 1300 is provided with a video signal output terminal 1312 and an input and output terminal for data communication 1314 on a side surface of the case 1302. As illustrated in FIG. 23, a television monitor 1430 is connected to the video signal output terminal 1312 and a personal computer 1440 is connected to the input and output terminal for data communication 1314, respectively, as required. The image pickup signal stored in the memory 1308 is output to the television monitor 1430 or the personal computer 1440 by a predetermined operation. In such a digital still camera 1300, the physical quantity sensor 1 functioning as an acceleration sensor is incorporated, and a control unit 1316 can perform control such as hand-shake correction based on the measurement data of the physical quantity sensor 1. Since such a digital still camera 1300 is provided with a temperature sensor (not illustrated) and a correction unit (not illustrated) for correcting the temperature of the measurement signal measured by the physical quantity sensor 1, it is possible to perform control such as attitude control with higher accuracy.

Since such an electronic apparatus includes the physical quantity sensor 1, the control units 1110, 1201, and 1316, and the correction unit (not illustrated), it has excellent reliability.

An electronic apparatus including the physical quantity sensor 1 can be applied to, for example, a tablet terminal, a clock, an ink jet type discharging device (for example, an ink jet printer), a laptop type personal computer, a television, a video camera, a video tape recorder, a car navigation device, a pager, an electronic organizer (including communication function), an electronic dictionary, a calculator, an electronic game machine, a word processor, a workstation, a video phone, a security monitor for television, an electronic binocular, a POS terminal, a medical device (for example, an electronic thermometer, a blood pressure monitor, a blood glucose meter, an electrocardiogram measurement device, ultrasonic diagnostic equipment, electronic endoscope), a fish finder, various measuring instruments, instruments (for example, instruments of vehicles, aircraft, ships), a flight simulators, a seismographs, a pedometers, an inclinometers, a vibrometer to measure vibration of a hard disk, an attitude control device of aircraft such as a robot and a drone, control equipment used for inertial navigation for automatic operation of automobile, and the like, in addition to the personal computer of FIG. 21, the smart phone (mobile phone) of FIG. 22, the digital still camera of FIG. 23.

Figure 24A:
FIG. 24A is a plan view illustrating a configuration of an activity meter which is an example of an electronic apparatus.
Figure 24B:
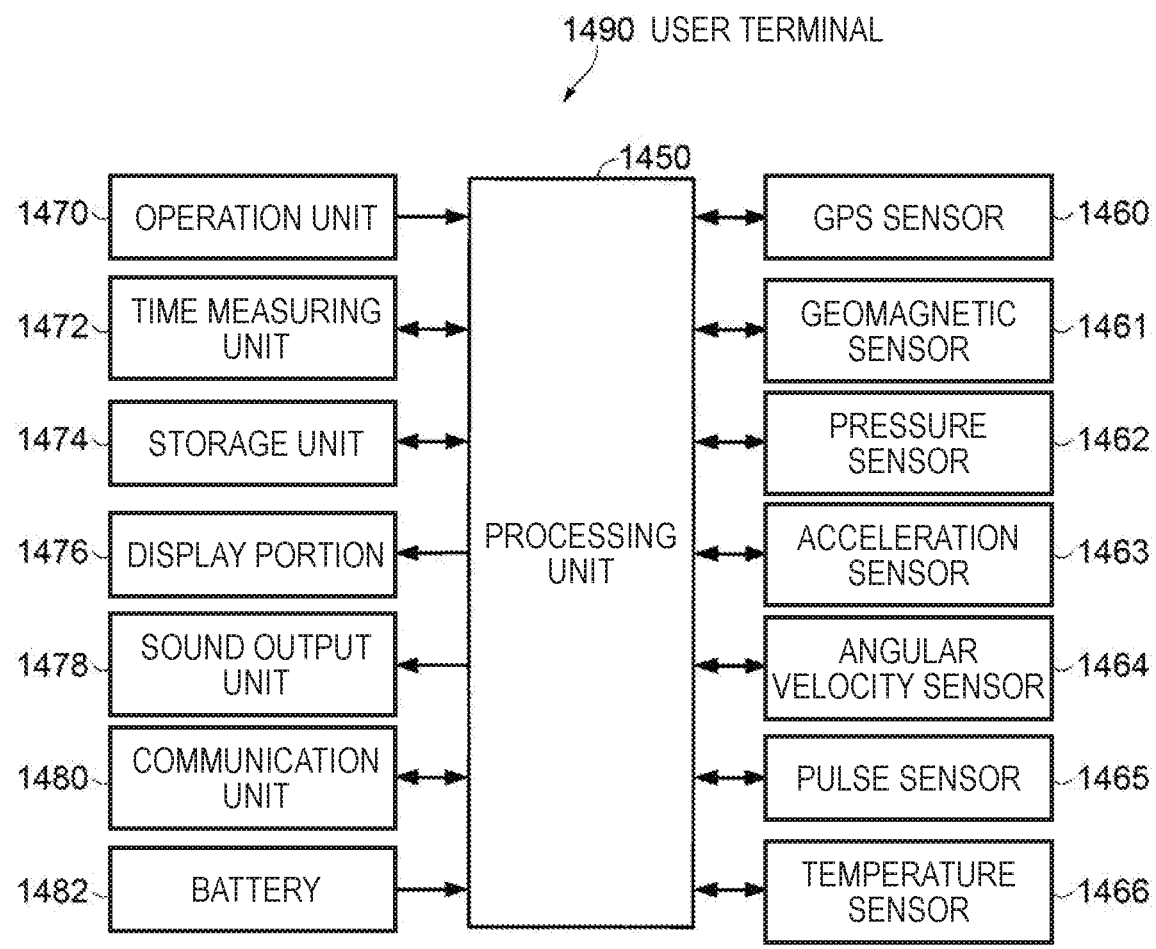
FIG. 24B is a functional block diagram for explaining functions of the activity meter which is an example of an electronic apparatus.

A watch type activity meter (active tracker) will be described as an example of an electronic apparatus with reference to FIGS. 24A and 24B. FIG. 24A is a plan view illustrating a configuration of an activity meter which is an example of an electronic apparatus, and FIG. 24B is a functional block diagram for explaining functions of the activity meter which is an example of an electronic apparatus.

The activity meter is attached to a site (subject) such as a wrist by a band or the like, has a display portion of digital display and can perform wireless communication. The physical quantity sensor 1 according to the invention is incorporated in a watch type activity meter 1400 as an acceleration sensor and an angular velocity sensor.

On a liquid crystal display (LCD) constituting a display portion, depending on each measurement mode, for example, position information using a GPS or a geomagnetic sensor, motion information such as movement amount, exercise amount using an acceleration sensor or an angular velocity sensor, biometric information such as pulse rate using a pulse wave sensor, time information such as current time, and the like are displayed.

The activity meter 1400 can be widely applied to a running watch, a runner's watch, a multi-sports compatible runner's watch such as Duathlon and triathlon, an outdoor watch, a satellite positioning system such as a GPS watch in which GPS is installed and the like.

The activity meter 1400 is attached to a given part (for example, a wrist) of a user (wearer), and can measure the user's position information, exercise information and the like. As illustrated in FIG. 24A, the activity meter 1400 includes a device main body 1410 attached to a user for measuring position information, exercise information and the like, and a first band portion 1412 and a second band portion 1414 attached to the device main body 1410 and attaching the device main body 1410 to the user. In addition to the user's position information and exercise information, the activity meter 1400 can be provided with a function of measuring biological information such as pulse wave information and a function of acquiring time information and the like.

Next, the function of the activity meter 1400 will be described with reference to FIG. 24B.

As illustrated in FIG. 24B, a processing unit 1450 (processor) is configured by, for example, a micro processing unit (MPU), a digital signal processor (DSP), an application specific integrated circuit (ASIC). The processing unit 1450 executes various processes based on the program stored in a storage unit 1474 and the signal input from an operation unit 1470. Processing by the processing unit 1450 includes data processing for each output signal of a GPS sensor 1460, a geomagnetic sensor 1461, a pressure sensor 1462, an acceleration sensor 1463, an angular velocity sensor 1464, a pulse sensor 1465, a temperature sensor 1466, and a time measuring unit 1472, display processing for displaying an image on a display portion 1476, a sound output process for outputting a sound to the sound output unit 1478, a communication process for communicating with a user terminal 1490 via a communication unit 1480, a power control process for supplying power from a battery 1482 to each unit, and the like.

The communication unit 1480 includes, for example, Bluetooth (registered trademark) (including BTLE: Bluetooth Low Energy), Wi-Fi (registered trademark) (Wireless Fidelity), Zigbee (registered trademark), near field communication (NFC), and ANT+ (registered trademark) as a transmitter and receiver compatible with the short distance wireless communication standard and the communication unit 1480 is configured to include a connector compatible with a communication bus standard such as a universal serial bus (USB).

The acceleration sensor 1463 as the physical quantity sensor 1 according to the invention measures each acceleration in three axis directions intersecting (ideally, orthogonal) each other, and outputs a signal (acceleration signal) corresponding to the magnitude and direction of the measured three-axis acceleration.

The angular velocity sensor 1464 as the physical quantity sensor 1 according to the invention measures each angular velocity in three axis directions intersecting (ideally, orthogonal) each other, and outputs a signal (angular velocity signal) corresponding to the magnitude and direction of the measured three-axis angular velocity.

The watch type activity meter 1400 has the following functions.

Distance: Measure the total distance from the start of measurement with high accuracy GPS function.

Pace: Display the current travel pace from the pace distance measurement.

Average speed: Calculate and display average speed from the average speed running start to the present.

Height: Measure and display altitude by GPS function.

Stride: Measure and display the stride even in a tunnel and the like where GPS radio waves do not reach.

Pitch: Measure and display the number of steps per minute.

Heart Rate: Measure and display heart rate with pulse sensor.

Gradient: Measure and display the gradient of the ground in training and trail runs in the mountains.

Autolap: Automatically perform lap measurement when running for a fixed distance or for a fixed time set in advance.

Exercise consumption calorie: Display calorie consumption.

Number of steps: Display the total number of steps from the start of the exercise.

Although the global positioning system (GPS) is exemplified for describing a satellite positioning system, other global navigation satellite systems (GNSS) may be used. For example, any one or more satellite positioning system of European Geostationary-Satellite Navigation Overlay Service (EGNOS), Quasi Zenith Satellite System (QZSS), Global Navigation Satellite System (GLONASS), GALILEO, BeiDou Navigation Satellite System (BeiDou) may be used. Satellite based augmentation systems (SBAS) such as a wide area augmentation system (WAAS), a European geostationary satellite navigation overlay service (EGNOS) may be used for at least one of the satellite positioning systems.

Vehicle

Figure 25:
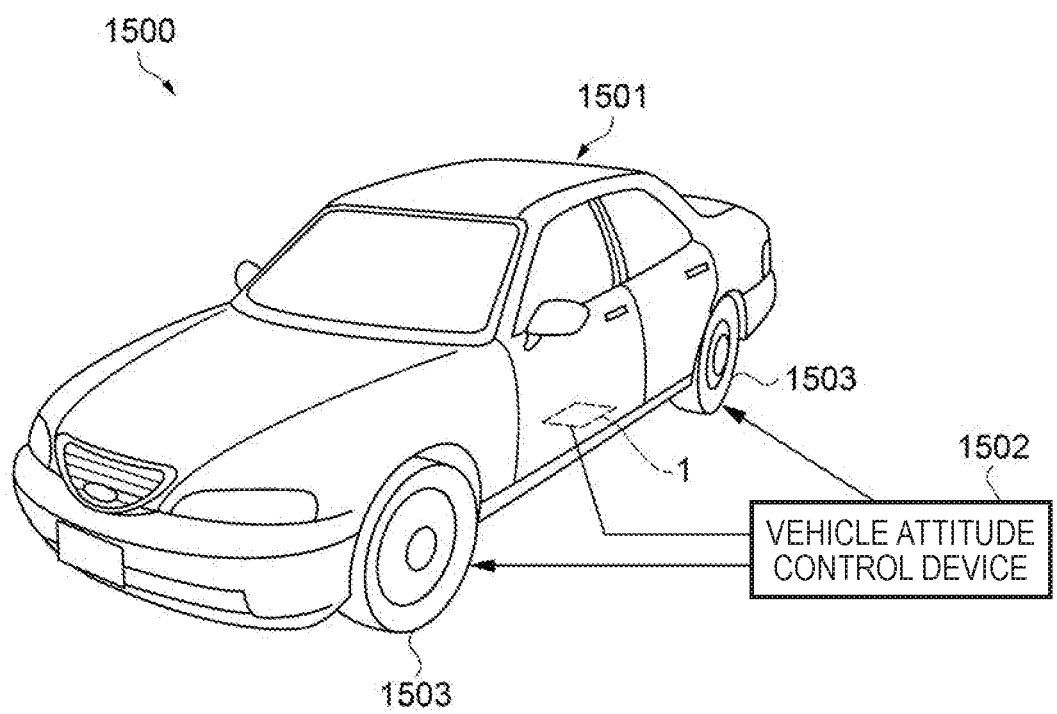
FIG. 25 is a perspective view illustrating a configuration of an automobile which is an example of a vehicle.

Next, an example in which the physical quantity sensor 1 is used as a representative example of a vehicle using the physical quantity sensors 1, 1a, 1b, 1c, 1d, 1e, and 1f is illustrated in FIG. 25 and described in detail. FIG. 25 is a perspective view illustrating a configuration of an automobile which is an example of a vehicle.

As illustrated in FIG. 25, the physical quantity sensor 1 is incorporated in an automobile 1500, and for example, an attitude of a vehicle body 1501 may be measured by the physical quantity sensor 1. A measurement signal of the physical quantity sensor 1 is supplied to a vehicle attitude control device 1502 as an attitude control unit, and the vehicle attitude control device 1502 measures the attitude of the vehicle body 1501 based on the signal. It is possible to control the hardness of the suspension according to the measurement result and to control the brakes of individual wheels 1503. The physical quantity sensor 1 can also be widely applied to a keyless entry, an immobilizer, a car navigation system, a car air conditioner, an antilock brake system (ABS), an airbag, a tire pressure monitoring system (TPMS), engine control, an inertial navigation control equipment for automatic operation, and an electronic control unit (ECU) such as a battery monitor of a hybrid car or an electric car.

The physical quantity sensor 1 applied to a vehicle may be used in other application examples, for example, an attitude control of a bipedal walking robot and train, an attitude control of a remote control of a radio control airplane, a radio control helicopter or a drone or autonomous aircraft, an attitude control of an agricultural machinery (farm machine), or a construction machine (construction machine). As described above, the physical quantity sensor 1 and the attitude control unit (not illustrated) are incorporated to realize attitude control of various vehicles.

Since such a vehicle is provided with the physical quantity sensor 1 and an attitude control unit (not illustrated), it has excellent reliability.

The physical quantity sensors 1, 1a, 1b, 1c, 1d, 1e, and 1f, an inertial measurement system (3000), electronic apparatuses (1100, 1200, 1300, and 1400), and a vehicle (1500) are described based on drawings of embodiments. However, the invention is not limited to them. The configuration of each part can be replaced with any configuration having the same function. Further, any other constituent may be added to the invention.

In the above-described embodiments, the configuration in which the acceleration sensor element has three sensor units is described, the number of sensor portions is not limited to this, and may be one, two, or four or more. In the above-described embodiments, an acceleration sensor element is used as a sensor element of a physical quantity sensor. However, the sensor element of the physical quantity sensor is not limited to an acceleration sensor element, and may be, for example, a pressure sensor element or an angular velocity sensor element. For example, it may be a complex sensor capable of simultaneously measuring different physical quantities such as acceleration and angular velocity.

The entire disclosure of Japanese Patent Application No. 2017-155110 filed Aug. 10, 2017 is expressly incorporated by reference herein.

What is claimed is:

1. A physical quantity sensor comprising:
a container including:
a base, the base having:
a bottom member, the bottom member being configured with a plurality of stacked layers and a ground electrode layer sandwiched between two layers of the plurality of stacked layers; and
a side wall located at a periphery of the bottom member, the side wall standing from the periphery of the bottom member along a first direction; and
a lid covering the base to create a storage space inside the container;
a sensor element disposed in the storage space, a bottom surface of the sensor element being attached directly on an inner bottom surface of the bottom member, the inner bottom surface facing the lid; and
a circuit element disposed in the storage space, a bottom surface of the circuit element being attached directly on a top surface of the sensor element, the circuit element being electrically connected with the sensor element, wherein the ground electrode layer is spaced apart from the inner bottom surface of the bottom member.

2. The physical quantity sensor according to claim 1, wherein the ground electrode layer overlaps the sensor element along the first direction.

3. The physical quantity sensor according to claim 1, wherein the plurality of stacked layers is configured by three stacked layers.

4. The physical quantity sensor according to claim 1, wherein the lid is conductive, and the lid is fixed to a ledge of the side wall to seal the storage space of the container.

5. The physical quantity sensor according to claim 4, wherein the lid and the ground electrode layer are electrically connected to each other by a conductive layer formed in a castellation provided on the side wall of the container or by a conductor filled in a hole penetrating the side wall of the container.

6. The physical quantity sensor according to claim 1, wherein the lid is fixed to a ledge of the side wall to seal the storage space of the container.

7. The physical quantity sensor according to claim 6, further comprising:
a conductor that is filled in a through-hole penetrating the bottom member at a position overlapping with the ground electrode layer along the first direction,
wherein the lid and the ground electrode layer are electrically connected to each other by the conductor.

8. The physical quantity sensor according to claim 1, further comprising:
an adhesive fixing the bottom surface of the sensor element to the inner bottom surface of the bottom member of the container, and
wherein, in a region overlapping with an adhesion region where the sensor element is adhered to the inner bottom surface by the adhesive, the ground electrode layer is spaced apart from the inner bottom surface of the bottom member of the container.

9. The physical quantity sensor according to claim 1, further comprising:
a plurality of wirings in the container including an analog wiring and a signal wiring,
wherein a width of the analog wiring is larger than a width of the signal wiring.

10. The physical quantity sensor according to claim 9, wherein the width of the analog wiring is L1;
the width of the signal wiring is L2; and $$L1/L2 \geq 2.$$

11. The physical quantity sensor according to claim 1, wherein the sensor element is an acceleration sensor.

12. The physical quantity sensor according to claim 1, further comprising:
an angular velocity sensor element installed in the container.

13. An inertial measurement unit comprising:
the physical quantity sensor according to claim 11;
an angular velocity sensor; and
a controller configured to control the physical quantity sensor and the angular velocity sensor.

14. A physical quantity sensor comprising:
a substrate that is configured with a plurality of stacked layers and a ground electrode layer sandwiched between two layers of the plurality of stacked layers;
a side wall located at a periphery of the substrate, the side wall standing from the periphery of the substrate along a first direction;
a lid covering a ledge of the side wall to create a storage space that is enclosed by the lid, the side wall, and the substrate;
a sensor element disposed in the storage space, a first surface of the sensor element being directly adhered to an inner bottom surface of the substrate inside the storage space; and
a circuit element disposed in the storage space, a surface of the circuit element being directly adhered to a second surface of the sensor element inside the storage space, the second surface being opposite to the first surface, the circuit element being electrically connected with the sensor element, wherein the ground electrode layer is spaced apart from the inner bottom surface of the substrate, and an end of the ground electrode layer reaches to an outer side surface of the substrate to be exposed to an outside, and the ground electrode layer overlaps at least part of the sensor element along the first direction.

15. The physical quantity sensor according to claim 14, wherein the ground electrode layer overlaps an entirety of the sensor element along the first direction.

16. The physical quantity sensor according to claim 14, wherein the lid is conductive, and the ground electrode layer is electrically connected to the lid.

* * * * *